United States Patent
Parks et al.

(10) Patent No.: US 8,828,776 B2
(45) Date of Patent: Sep. 9, 2014

(54) DIFFUSION FURNACES EMPLOYING ULTRA LOW MASS TRANSPORT SYSTEMS AND METHODS OF WAFER RAPID DIFFUSION PROCESSING

(75) Inventors: Richard W. Parks, Port Angeles, WA (US); Luis Alejandro Rey Garcia, Long Beach, CA (US); Peter G. Ragay, Anaheim, CA (US)

(73) Assignee: TP Solar, Inc., Paramount, CA (US)

( * ) Notice: Subject to any disclaimer, the term of this patent is extended or adjusted under 35 U.S.C. 154(b) by 339 days.

(21) Appl. No.: 13/540,482

(22) Filed: Jul. 2, 2012

(65) Prior Publication Data

US 2012/0269226 A1 Oct. 25, 2012

Related U.S. Application Data

(63) Continuation-in-part of application No. 13/213,503, filed on Aug. 19, 2011, now Pat. No. 8,236,596, which is a continuation-in-part of application No. 12/761,632, filed on Apr. 16, 2010, now Pat. No. 8,039,289.

(60) Provisional application No. 61/170,051, filed on Apr. 16, 2009.

(51) Int. Cl.
*H01L 21/66* (2006.01)
*H01L 21/38* (2006.01)
(Continued)

(52) U.S. Cl.
CPC ............ *F27B 9/20* (2013.01); *H01L 21/67706* (2013.01); *H01L 21/67173* (2013.01); *F27B 9/243* (2013.01); *H01L 21/6776* (2013.01); *F27B 17/0025* (2013.01); *H01L 21/2254* (2013.01); *F27D 5/0037* (2013.01); *H01L 31/18* (2013.01); *H01L 21/67115* (2013.01); *H01L 21/67109* (2013.01); *H01L 21/324* (2013.01)
USPC ............. 438/61; 438/542; 438/715; 438/652; 198/339.1; 198/606; 257/E21.082; 257/E21.135; 257/E21.145; 257/E21.158

(58) Field of Classification Search
None
See application file for complete search history.

(56) References Cited

U.S. PATENT DOCUMENTS 3,299,196 A 1/1967 Lasch et al.
3,828,726 A 8/1974 Dietze et al.
(Continued)

OTHER PUBLICATIONS

Tecnofimes solid ceramic roller diffusion furnace, www.tecnofimes.com/photovoltaic, May 26, 2010, 2 pgs.
(Continued)

*Primary Examiner* — Mohsen Ahmadi
(74) *Attorney, Agent, or Firm* — Innovation Law Group, Ltd.; Jacques M. Dulin, Esq.

(57) ABSTRACT

Multi-zone, solar cell diffusion furnaces having a plurality of radiant element (SiC) or/and high intensity IR lamp heated process zones, including baffle, ramp-up, firing, soaking and cooling zone(s). The transport of solar cell wafers, e.g., silicon, selenium, germanium or gallium-based solar cell wafers, through the furnace is implemented by use of an ultra low-mass, wafer transport system comprising laterally spaced shielded, synchronously driven, metal bands or chains carrying non-rotating alumina tubes suspended on wires between them. The wafers rest on raised circumferential standoffs spaced laterally along the alumina tubes, which reduces contamination. The high intensity IR flux rapidly photo-radiation conditions the wafers so that diffusion occurs >3× faster than conventional high-mass thermal furnaces. Longitudinal side wall heaters comprising coil heaters in Inconel sheaths inserted in carrier tubes are employed to insure even heating of wafer edges adjacent the side walls.

20 Claims, 16 Drawing Sheets

(51) Int. Cl.

| | |
|---|---|
| *H01L 21/22* | (2006.01) |
| *H01L 21/461* | (2006.01) |
| *H01L 21/302* | (2006.01) |
| *H01L 21/677* | (2006.01) |
| *H01L 21/67* | (2006.01) |
| *F27B 9/24* | (2006.01) |
| *F27B 17/00* | (2006.01) |
| *H01L 21/225* | (2006.01) |
| *F27D 5/00* | (2006.01) |
| *F27B 9/20* | (2006.01) |
| *H01L 31/18* | (2006.01) |
| *H01L 21/324* | (2006.01) |

(56) References Cited

U.S. PATENT DOCUMENTS

| | | |
|---|---|---|
| 4,516,897 A | 5/1985 | Snider et al. |
| 5,387,546 A | 2/1995 | Maeda et al. |
| 5,820,679 A | 10/1998 | Yokoyama et al. |
| 6,407,327 B1 * | 6/2002 | Ralph et al. ............ 136/244 |
| 6,841,006 B2 | 1/2005 | Barnes et al. |
| 7,205,231 B2 * | 4/2007 | Frisella et al. ............ 438/663 |
| 7,220,321 B2 * | 5/2007 | Barth et al. ............ 118/729 |
| 7,805,064 B2 | 9/2010 | Ragay et al. |
| 7,915,154 B2 | 3/2011 | Piwczyk |
| 8,071,921 B2 | 12/2011 | Lewin |
| 2009/0130832 A1 | 5/2009 | Sontag |
| 2010/0220983 A1 | 9/2010 | Doherty et al. |
| 2010/0272544 A1 | 10/2010 | Rivollier et al. |

OTHER PUBLICATIONS

Sierra Therm XR Series Roller Hearth Diffusion Furnace, www.sierratherm.com/process-applications/solar-cell, 5 pgs., May 26, 2010.

* cited by examiner

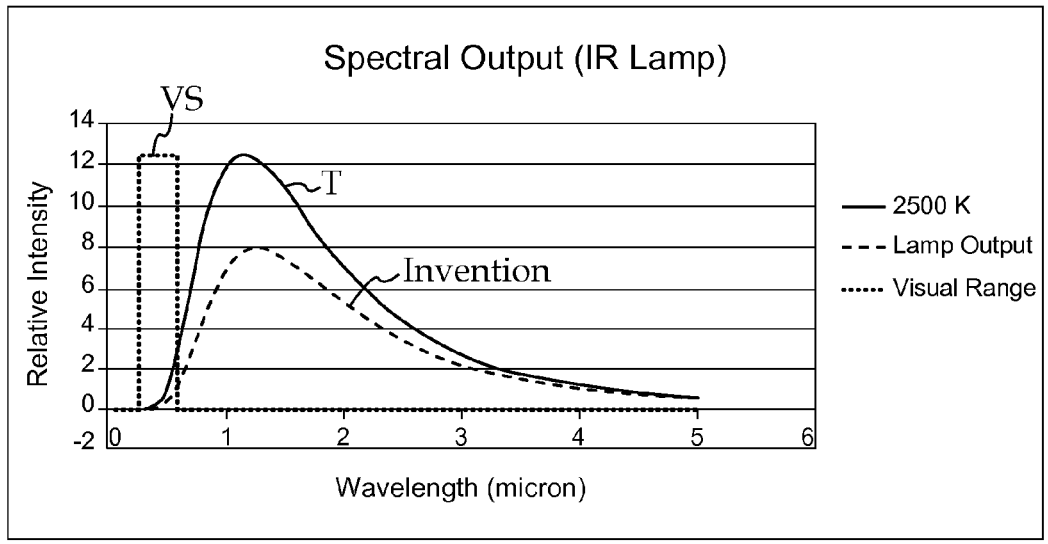
FIG. 6A Inventive Low-Mass Transport System
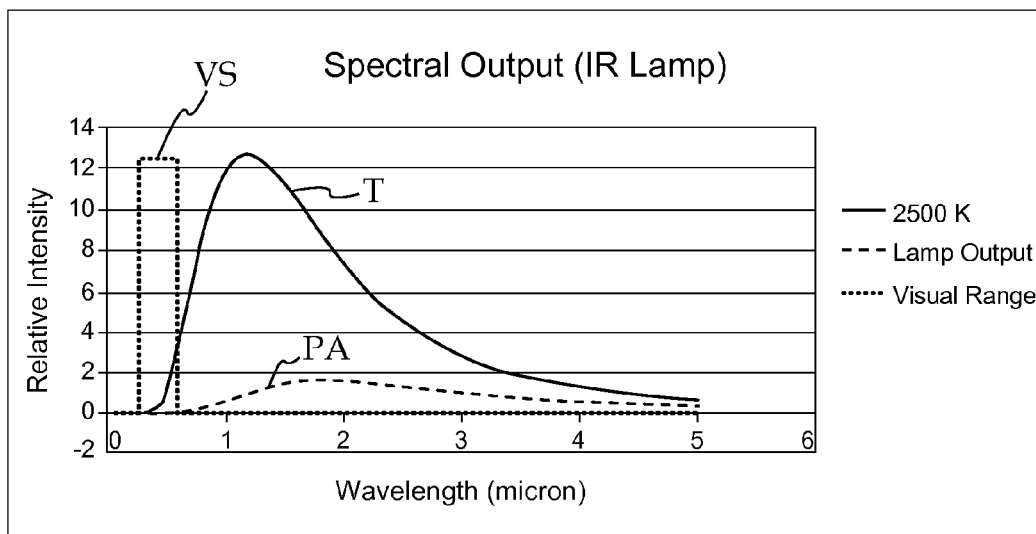
FIG. 6B Prior Art High-Mass Solid Roller System

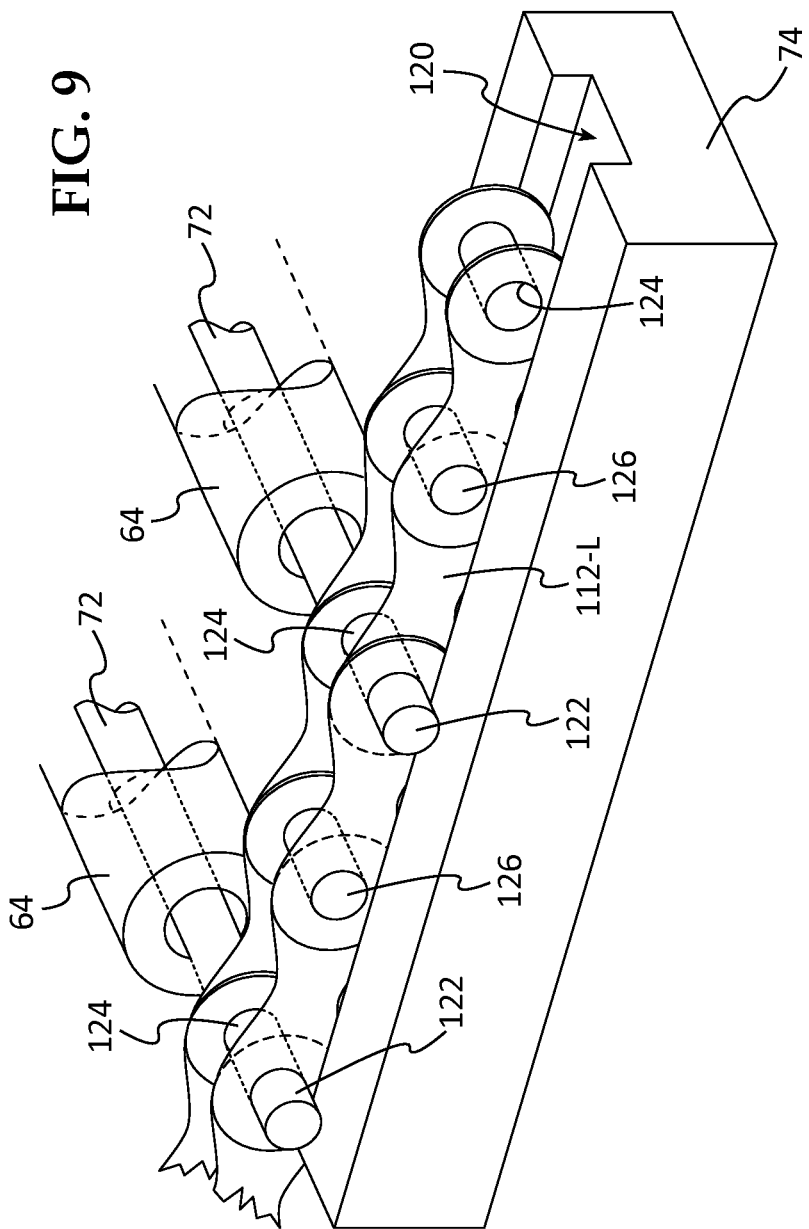

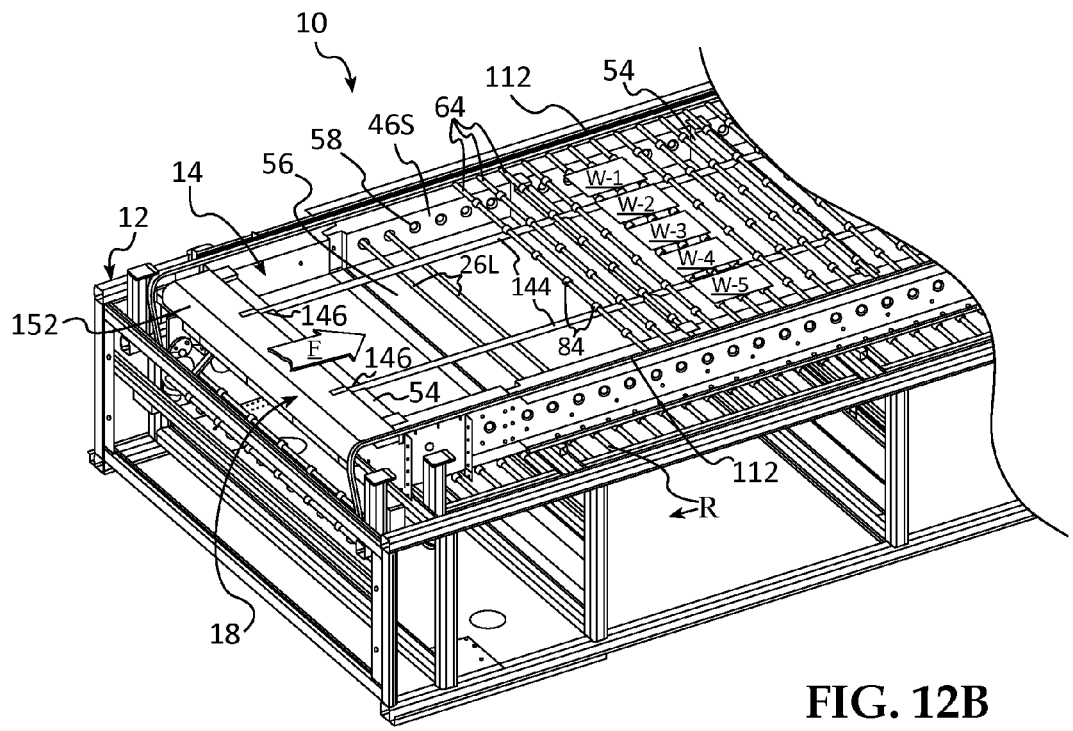
FIG. 12B
FIG. 13
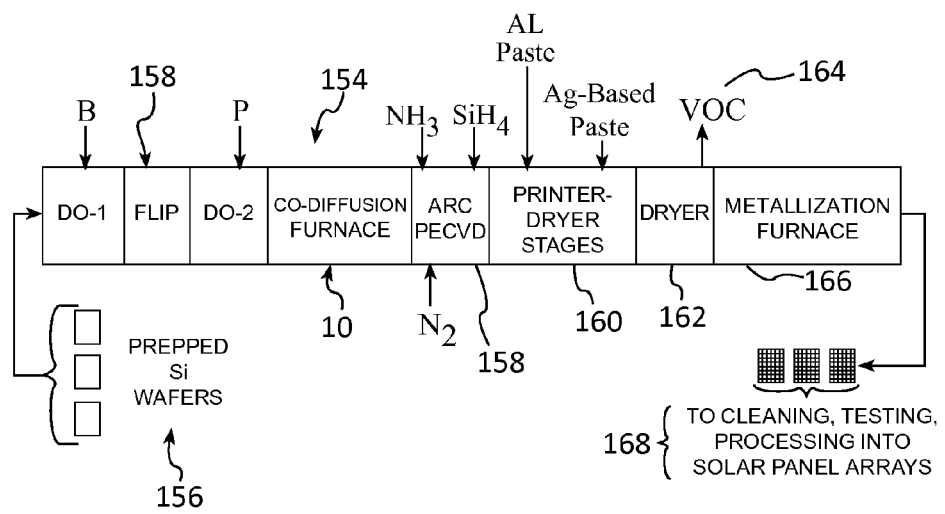

DIFFUSION FURNACES EMPLOYING ULTRA LOW MASS TRANSPORT SYSTEMS AND METHODS OF WAFER RAPID DIFFUSION PROCESSING

CROSS-REFERENCE TO RELATED CASES

This application is a Divisional and a CIP of Regular U.S. patent application Ser. No. 13/213,503 filed Aug. 19, 2011 by the same inventors under the same title, now U.S. Pat. No. 8,236,596 issued on Aug. 7, 2012, which in turn is a Divisional and CIP of Regular U.S. patent application Ser. No. 12/761,632, filed Apr. 16, 2010, by the same inventors under the same title, now U.S. Pat. No. 8,039,289 issued on Oct. 18, 2011, which in turn claims the benefit of U.S. Provisional Application Ser. No. 61/170,051 filed by the same inventors on Apr. 16, 2009, entitled Diffusion Furnace Having Low Mass Band Transport System and Rapid Diffusion Process Using High Intensity IR Flux, the benefit of the filing dates of these applications is hereby claimed under 35 US Code, Sections 119 ff.

FIELD

The invention relates to continuous conveyor, multi-lane diffusion furnaces for processing solar cell wafers by use of radiant resistance or/and IR lamp heating in the range of 700-1100° C. to cause the diffusion or/and co-diffusion of P and/or B dopant compositions into the silicon (or other advanced material) of the wafer to create a p-n junction surface layer or/and back surface field layer. More specifically, the invention is directed to a solar cell diffusion furnace having one or more heating zones and an ultra-low mass, low friction, transverse, wire-suspended alumina tube transport system, supplemented by longitudinal side-wall radiant heaters. The inventive diffusion furnace with low mass transport system provides a rapid diffusion process cycle by use of thermal radiant heating or/and high intensity IR radiant flux in one or more of the process zones, resulting in faster diffusion processing, longer transport system life, reduced wafer contamination, faster/higher throughput with greater yield of properly doped cells, and lower energy, operating and maintenance costs.

BACKGROUND

The fabrication of silicon based solar cells requires a number of specialized processes to occur in a specific order. Generally these processes include single crystalline silicon ingots grown in crystal growing furnaces or cast into multi-crystalline blocks in "directional solidification" furnaces. The result of these processes are long "sausage-shaped" single crystal masses called ingots, or multi-crystalline blocks, from which thin slices of silicon are cut transversely with "wire saws" to form rough solar cell wafers. These wafers, whether made up of a single crystal or multiple crystals conjoined together, are then processed to form smooth wafers in the 140 to 330 micrometer range of thickness. Because of the scarcity of suitable silicon, the current trend is towards making the wafers thinner, typically 140-180 micrometers thick.

Finished raw wafers are then processed into functioning solar cells, capable of generating electricity by the photovoltaic effect. Wafer processing starts with various cleaning and etching operations, followed by a 2-stage process called diffusion which creates a semi-conducting "p-n", junction diode, followed by a third process in which Silver and Aluminum paste-based coatings are screen printed on the wafer front and back sides respectively, and then fired into the p-n junction grid and back contact layer, where they act as ohmic collectors and grounds, respectively.

The diffusion process broadly comprises two stages: a first stage of applying (coating) and drying one or more types of dopant materials to the front and/or back side of the wafers, followed by a second stage of heating (firing) the coated wafers in a diffusion furnace, chamber, or heating zone, to cause diffusion of the dopant composition into the Si (or other advanced material) wafer substrate to form the p-n junction layer, or back contact layer. This invention is directed to improved diffusion furnaces and firing processes, schedules and thermal profiles. The following is a summary of the subsequent steps of processing diffusion fired wafers, which puts the invention into context.

Diffusion occurs at high temperatures in the presence of various phosphorous (P) or boron (B) sources. The P is used to produce p-type junctions on a top surface of a wafer, while B is used on the back side surface for n-type junctions. Considering P sources by way of example, the P may be provided as a sprayed liquid of dilute phosphoric acid or a vapor of phosphorous oxichloride ($POCl_3$) created by bubbling nitrogen, $N_2$, through liquid $POCL_3$. After drying and firing, the P-doped Si forms the "emitter" layer of the photovoltaic cell, that is, the layer that emits electrons upon exposure to sunlight (the normal photon source). These electrons are collected by a fine web of screen printed metal contacts that are sintered into the surface of the cell by a metallization furnace, as mentioned above.

For a more advanced process employing concentrated phosphoric acid, see our copending application U.S. Ser. No. 13/230,481, US Patent Application Publication US 2012-0149182.

To enhance the ability to form low resistance screen-printed metal contacts to the underlying silicon p-n junction emitter layer, a selected amount of a phosphorus compound is deposited onto the front surface of the wafer. The P is driven into the wafer via a high temperature diffusion process. Current processes typically last 20-30 minutes. The extra "electrically active" P enables the low resistance contacts to be formed. However, the formation of such contacts is at the expense of a loss in cell efficiency. The cell efficiency loss arises as a result of electron-hole pairs generated at or near the surface through the absorption of higher energy but short wave length photons. These "blue light" photons quickly recombine and are lost, thereby eliminating their contribution to the power generation of the cell.

In co-diffusion, a Boron compound is applied to the back surface of the wafer and a Phosphorous compound is applied to the top surface. The wafer is heated in a single firing to simultaneously co-diffuse both the B and the P into their respective bottom and top surfaces.

After diffusion and various cleaning, laser edge ablation, and etching processes to remove unwanted semi-conductor junctions from the sides of the wafers, the wafers are coated with an anti-reflective coating, typically silicon nitride ($SiN_3$), generally by plasma-enhanced chemical vapor deposition (PECVD). Between some of these processes, the wafers are dried in preparation for subsequent processes in low temperature drying ovens.

The $SiN_3$ anti-reflective coating (ARC) is deposited to a thickness of approximately ¼ the average wavelength of light of 0.6 microns. After ARC application, the cells exhibit a deep blue surface color (or brown color, depending on the coating material used). The ARC minimizes the reflection of incident photons having wavelengths around 0.6 microns. The ARC SiN$_x$ coating is created in the PECVD process by mixing silane, SiH$_4$, ammonia, NH$_3$, and pure nitrogen, N$_2$, gases in various concentrations in a high or low frequency microwave field. The hydrogen dissociates and diffuses very rapidly into the silicon wafer. The hydrogen has a serendipitous effect of repairing bulk defects, especially in multi-crystalline material. The defects are traps where electron-hole pairs can recombine thereby reducing cell efficiency or power output.

During subsequent IR metallization firing, elevated temperatures (above 850° C.) will cause the hydrogen to diffuse back out of the wafer. Thus, short firing times are necessary to prevent this hydrogen from 'out-gassing' from the wafer. It is best that the hydrogen is captured and retained within the bulk material (especially in the case of multi-crystalline material).

The back surface typically is fully covered by an Aluminum-based paste, while the front or top surface is screen printed with a fine network of silver-based lines connected to larger buss conductors to "collect" the electrons generated within the depleted region of the underlying doped Si emitter or near the surface. At the same time, the highest possible open area is left uncovered for the conversion of light into electricity. After these pastes have been dried, they are "co-fired". The back surface Aluminum paste forms alloys while the front surface paste is sintered at high speed and at high temperature in conveyor-type metallization furnaces to form smooth, low ohmic resistance conductors on the front surface of the solar cell.

The instant invention is directed to improved diffusion firing furnaces and diffusion processes. Currently available IR conveyor furnaces for such diffusion firing processes have a long heating chamber in which a plurality of IR lamps are substantially evenly spaced apart (typically 1.5" apart) both above and below the wafer transport system (wire mesh belt or ceramic roller conveyor). The heating zone is insulated from the outside environment with various forms of insulation, compressed insulating fiber board being the most common. The infra-red (IR) lamps increase the temperature of the incoming silicon wafers to approximately 700° C. to 950° C. This temperature is held for the 30-minute duration of the diffusion process, after which the wafers are cooled and transferred to the next downstream process operation and equipment.

Currently available diffusion furnaces typically employ one of two types of wafer transport systems: 1) a plurality of static (not-longitudinally moving), solid ceramic, rotating rollers; or 2) active (longitudinally moving) wire mesh belts, to convey the wafers through the furnace firing zone. Static, ceramic rotating-roller furnaces currently are preferred in order to minimize or prevent metallic contamination of the back surface of the wafers. These furnaces typically have a working width of 1 to 2 meters, permitting wafers to be placed side by side on the belt or roller conveyor, thus being termed "multi-lane" furnaces.

A typical conventional diffusion furnace is on the order of 400" long, having 160, 36"-wide IR lamps placed above the rollers, with from 100-160 lamps placed below. The total mass of the conveyor rollers is on the order of 800 lbs, and is classified as a high-mass conveyor system.

In such high-mass, static, solid, rotating roller conveyor furnaces, the IR lamps take substantial time to bring the furnace chamber up to diffusion temperature in the range of 700° C. to 950° C. The theory of operation apparently is that the heated roller mass helps keep the furnace at a more even temperature throughout, as a result of the thermal reserve provided by a large, hot mass having a substantial heat capacity. Such furnace systems are touted as being able to compensate, in the short term, for failure of one or several IR lamps, if spread throughout the furnace, since the hot rollers continue to provide heat via conduction and convection. The IR lamps below the rollers maintain the rollers hot, and the contact of the wafers with the rollers help transfer heat to the wafers by thermal contact conduction. Since the rollers at the entrance and exit are not heated by the same number of lamps as those in the center of the furnace, there is a thermal profile along the conveyor, rising at the entrance and descending at the exit.

As for wire mesh belt conveyors, the belts must be medially supported by quartz tubes to prevent belt sag and provide a low friction sliding surface. Typically, a pair of tubes are placed, one on either side of the longitudinal centerline of the belt. Since the tubes shadow the under-side of the wafers, to prevent "cool" stripes on the wafers, the tubes are arranged in a herringbone pattern, which evens out the radiant exposure. However, the tubes are expensive, add mass to the conveyor system and block access to the lower heating zone of the furnace. In a Top Lift type furnace, the conveyor can be operated during maintenance and inspection, hot or cold. However, in a Bottom Drop furnace, the tube supports move down with the lower half of the furnace while the conveyor belt remains suspended, so the conveyor cannot be operated when open.

As the demand for solar cells increases, the rates of production must increase, either by process improvements or adding furnaces into service. With respect to adding furnaces, conventional furnaces have a large footprint and the diffusion process is very slow. In large part, because of the mass of ceramic in the furnace that provides thermal energy, the IR lamps are run at from about 15-20% of maximum power. Running them at greater power levels would easily raise the temperature higher than needed for diffusion, and approach failure of metallic components (e.g., in the roller drive elements secured to the ends of the rollers). Accordingly, the "soak" period to accomplish diffusion is long—on the order of 20-30 minutes. Thus, since the furnaces are large, adding furnaces requires increased capital outlay, for buildings, the furnaces themselves, and related service facilities.

Thus, the need for faster production and greater throughput while curbing facility capital outlay, is not being met by the current state of the art solid, rotating ceramic roller conveyor or wire mesh belt furnaces. In order to compensate, furnaces have been made laterally wider, so that multiple lines of wafers can be processed in each furnace zone. This in turn requires longer, more expensive lamps which typically experience a substantially shorter mean time to failure, thus significantly increasing operating costs.

Since there are dimensional and IR lamp cost constraints, increasing lamp density in the furnace is not generally a feasible solution. Likewise, increasing the power to the lamps is not currently feasible because higher output can result in overheating of the lamp elements, as a result of the thermal mass of the furnace, principally in the high mass solid ceramic roller conveyor system. Overheating particularly affects the external quartz tubes of the lamps. Most furnaces are thermocouple controlled. Since the IR lamps are placed side by side, on the order of 1.25" apart, each lamp heats the lamps adjacent to it. When the thermocouples detect temperatures approaching the selected diffusion temperature set point in the 700-950° C. range, they automatically cut back power to the lamps by an amount that depends on the thermal mass of the transport system (rollers, or metal mesh belts plus support tubes). This lower power density is accompanied by substantial changes in the spectral output of the IR lamp emissions (hence a lower light flux and energy output). In turn, this reduced light flux results in the need to slow down the conveyor belt speed or lengthen the furnace (while maintaining the original belt speed), thus slowing processing. Overheating of lamps, e.g., due to thermocouple delay or failure, can cause the lamps to deform, sag and eventually fail. Lamp deformation also affects uniformity of IR output delivered to the wafers.

Accordingly, there is an unmet need in the diffusion furnace and diffusion firing process art to significantly improve net effective use of firing zone(s), to provide better control and thermal profiles throughout the entire furnace, to permit improved utilization of firing energy, to improve the speed and uniformity of the diffusion process, to reduce furnace length while retaining or improving throughput, and accomplishing these goals on a reduced furnace footprint, and lower energy, operating and maintenance costs.

THE INVENTION

Summary, Including Objects and Advantages

These and other unmet needs in the art are met by the invention which is directed to a multi-zone solar cell diffusion furnace having an ultra low-mass, active transport system for conveying wafers through a plurality of heating and cooling zones, including at least one Inlet Baffle Zone, a Ramp-Up Zone, followed downstream by one or more Diffusion Soaking Zones and optionally a Diffusion Firing Zone, and one or more Cooling zone(s), for front and/or back side diffusion or/and co-diffusion of P or/and B dopants to form p- or n-type junctions and/or back contact layers in the wafer substrate. More particularly, the present invention is directed to ultra low-mass active transport systems of wafer firing furnaces that include anti-sag arresters and side wall heaters to insure even heating of wafers traversing along the outside lanes of multi-lane furnaces.

As disclosed herein by way of example, the inventive transport system is illustrated in two alternative embodiments: A) a band/pin drive system; and B) a roller chain/sprocket drive system, the latter being the presently preferred embodiment. In both embodiments, the wafers are supported during longitudinal transit through the processing zones on non-rotating small diameter hollow refractory tubes carried on suspension wires or rods spanning the width of the transport system. In the band/pin drive system, opposed ends of the wires are carried by pylons formed from, or attached to, the drive bands. In the roller chain/sprocket drive system the wire ends are journaled in the hollow tubes of the link pivots.

The inventive ultra low-mass active transport system is applicable to a wide range of furnace configurations, numbers of process zones, and type, positioning and numbers of heating elements. The heating elements employed in the inventive furnace in combination with the ultra low mass transport system are selected to provide thermal radiation or IR flux output suitable for the process, P diffusion, B diffusion or both, and are shown herein by way of example as IR lamp elements, resistance-type radiative/re-radiative elements, and a combination of both. For P-only diffusion, particularly in narrow width furnaces (typically having less than about a 24"-wide processing conveyor) IR lamps may be used, and it is optional to employ Hi-Intensity IR Lamp isolation modules, described below in more detail. In the presently preferred heating system transversely oriented IR lamps are used in the upper heating zone(s) while a combination of IR lamps and resistance heating is used in the lower heating zone. To improve lateral heating uniformity across the width of the furnace, resistance heaters are placed adjacent the two longitudinal side walls oriented parallel to and spaced apart from the centerline of the furnace, while the IR lamps are placed transversely above or below the longitudinal side wall resistance heating elements, preferably below. The longitudinal side wall resistance heaters are disposed in, and supported by, quartz, ceramic or stabilized SiC tubes disposed just below the conveyor. In a 5 lane or wider furnace they serve to keep the wafers in rows 1 and 5 adjacent the respective side walls at proper diffusion temperature. This is particularly useful in co-diffusion processing. For higher temperature processing, SiC rod-type resistance elements, optionally shielded within quartz, ceramic or stabilized SiC tubes are employed. Combinations of heating elements may be used; for example, free-standing (non-enclosed) IR lamps followed by High-Intensity IR lamp (enclosed) isolation module(s) may be used for ramp-up to near processing temperatures, followed by SiC resistance elements in the peak firing zone and in the soaking zone. The use of High-Intensity IR lamp isolation modules has the advantage of providing short wave lengths, high flux IR photo-conditioning which promotes faster diffusion. In the disclosure herein, where there is reference to High-Intensity IR lamps (HI-IR), it should be understood that SiC radiative/reradiative heating elements may be employed, the HI-IR lamp elements disclosure being by way of example only.

The transport of the advanced material solar cell wafers, such as silicon, selenium, germanium or gallium-based solar cell wafers, is implemented in the furnace zones by use of an ultra-low mass, active (longitudinally moving), shielded transport system comprising two or more continuous loops of laterally spaced-apart, transport elements, comprising narrow width "belts" carrying light weight, small diameter, non-rotating refractory tubes suspended on wires strung between the belts on each side of the wafer processing travel path. The refractory tubes are thin-wall, rigid ceramic or vitreous material, preferably selected from at least one of alumina, silica and zirconia.

The transport system "belts" are implemented in a number of exemplary embodiments, a first being laterally spaced-apart metal, horizontally oriented, flat bands or ribbons, each having multiple vertically extending pylons that are longitudinally spaced-apart along the belts. The pylons carry wires on which the refractory tubes are threaded. The wires extend laterally across the wafer travel path between the matched pairs of pylons, one on each band. In a second, presently preferred embodiment, each belt is a roller chain, e.g., a robust bicycle-type chain, having hollow tubes in place of solid link pieces. The refractory tube suspension wires are threaded through, and supported at their ends in the chain link tubes. In both embodiments, the transport elements, or "belts", are driven synchronously by a drive system, described in detail below. Keeping the belts synchronized in their movement keeps the wires carrying the refractory tubes parallel to each other and straight, that is, orthogonal to the direction of wafer travel along the processing path. Suitable alignment rollers or guides may be used.

However, the inventive ultra-low mass conveyor system has the important advantage of not requiring the use of conveyor support rods, hence essentially no shading of the wafer bottom surfaces which make efficient co-diffusion possible at higher transport speeds or shorter furnace lengths.

In both embodiments, the wafers are carried sequentially through the several zones of the diffusion furnace while resting on annular standoffs spaced along the refractory tubes, which results in less contamination. The standoffs may have a wide range of external profile configurations, e.g., conical, rounded (donut-shaped), vertical knife edge, slanted, bi-conical, square top fin, rib, and combinations of such shapes, and the like. The refractory material is preferably selected from a high temperature ceramic or vitreous material that can be precisely configured by casting, dry pressing, extrusion or machining, and preferably includes at least one of silica (including silica glasses), alumina and zirconia.

The inventive diffusion furnace in both embodiments typically has a number of zones: an Inlet Baffle Zone that raises the temperature from Room Temperature to 500° C. and is on the order of about 20-30 cm long; a Ramp-Up or Firing Zone that raises the temperature to the diffusion firing set point in the range of from about 900-1100° C. and is typically about 30-100 cm long; at least one Soaking Zone that maintains the temperature at about 900-1100° C. and is typically 120-200 cm long (e.g., 4, 40 cm modules); and one or more Cooling Zones (CZs) that brings the temperature back down to room temperature. The CZs are typically two or more zones, a first of 30-50 cm in length that drops the temperature from 900-1100° C. to 500° C., and a second on the order of 60-90 cm in length that drops the temperature from 500° C. to Room Temperature. The second Cooling Zone may be external of the furnace shell. Of course, one skilled in the art will readily appreciate that the length of the zones depends on process transport system width, rate of travel, and the heating profile and process schedule, including power to lamps, among others. Accordingly, the lengths of zones listed are non-limiting examples.

The Ramp-Up and/or Firing zone(s) configurations are not critical to the inventive apparatus or method of operation, there being a wide range of arrangement of the IR lamp or resistive heating elements. For example, in a first embodiment, for narrow width furnaces (narrow transport systems) or for top-side P doping only, all heating may be implemented using HI-IR radiant flux lamps in all zones. In such process applications it is optional to use a HI-IR zone employing IR lamp isolation modules to ramp the temperature to the preferred soak temperature. In other embodiments the several zones, including a ramp-up (buffer) zone, and the soaking zone(s) may be free-standing IR lamp heated zones.

In a second embodiment, for wide process path furnaces on the order of 1-2 meter-wide transport systems or for processes of doping with B, or front side with P and back side with B, where temperatures are above 950° C., e.g. in the range of 1000-1100° C., the firing heating elements may be resistive radiant types, such as SiC rods or coiled elements, optionally housed in protective quartz tubes, or re-radiant (opaque) ceramic-type tubes.

In either heating element configuration embodiment the heating elements may be mixed, that is, free-standing IR lamps, HI-IR radiant flux isolation modules, and resistance thermal radiant/re-radiant elements may be used. For example, the input ramp-up (baffle) zone may be free-standing IR lamps, optionally followed by a first HI-IR flux isolation module, followed by high temperature resistive radiant/re-radiant elements in a second firing zone and in the soaking zone(s). The soaking zone(s) may be simply an extension of the firing zone. Likewise, the firing zone may be an extension of a buffer or ramp-up zone. That is, the name(s) of the zones is not the governing factor, the selection of type, position and number of elements, above and below the transport system being implemented to achieve the desired firing temperatures and schedule for processing be it P diffusion, B diffusion, or both.

In the inventive low mass transport system, the wafers do not touch wire mesh belts or ceramic rollers, being supported on ceramic stand-offs such that there is no metal contamination, no hot spots are developed in the wafers, and the wafers do not wander to one side or the other, as in conventional roller conveyor systems. In addition, the diffusion process of this invention is a high radiant flux driven process, rather than being a thermally conductive, long wavelength process.

In the first wafer transport system embodiment, the transport system side edge bands include longitudinally evenly-spaced drive holes. Each band is configured in an endless loop comprising a transport section (for forward motion through the processing Zones) and a return section. The band loops are driven synchronously by one or more pin drive roller(s) at the outlet end of the furnace. Each band is tensioned individually by a tensioning system disposed in the return path. This drive arrangement results in the transport (top) segment bands being pulled through the furnace process zones. The transport system operates at very low tension, on the order of 20 psi or lower, preferably below about 5 psi. This results in less stretching of the belt, long life, low-friction during band transport, less wear, substantially no metallic contamination, and overall lower energy requirements for furnace operation.

The bands are typically high temperature resistant metal, such as a member of the family of austenitic nickel-based superalloys, a suitable, implementation, being Nichrome brand, 80/20 nickel/chromium alloy. Other band materials include titanium, Inconel, e.g. type 600 Inconel, or other high temperature alloys. The bands are on the order of 1" wide and 0.020" thick. The pins of the drive wheels are tapered and the band pin drive holes are $1/8"$-$3/16"$ in diameter. The pin drive holes typically spaced 1"-3" apart along the bands, depending on the number of pins and diameter of the pin drive roller. The bands slide in shielded channels on each side of the furnace zones, the channel members being constructed of alumina, silica, quartz or other high-temperature, low friction, ceramic material. The band channels are configured to provide at least partial shielding from the firing elements to minimize the heating of the bands. Optionally, the bands are cooled by directing ambient, or cooled, compressed air onto the bands, preferably from below, and channels or ports are provided on the exterior lateral side of the furnace zone module above the bands to exhaust the cooling air.

In the second transport embodiment, currently the preferred implementation embodiment, roller chains are used in place of bands, and the vertical pylons are not needed. Rather, the suspension wires are journaled at each end in a tubular sleeve pivot member of a side chain link. As in the band embodiment, each side chain slides in a groove or channel in, or straddles a guide ridge on slider blocks of low friction, high temperature ceramic material. The slider blocks may be continuous or spaced to bridge the juncture of adjacent zones, and also serve as guides to maintain the linear tracking and proper alignment of the chain. The chains are driven by a sprocket drive system (two laterally-spaced drive sprockets on a common drive shaft) located below the outlet or inlet end of the diffusion furnace. When the sprocket drive is at the outlet end, it is located downstream of redirecting idlers, steel sprockets or flanged wheels, that turn the chains from the horizontal process path downward to the drive sprockets. During the return, the chains pass over a spring-biased tensioning system on the return path. At the inlet end the redirecting idlers turn the returning chains upwardly back to the horizontal process path, completing the circuit.

Where the sprocket drive is located below the inlet end of the return path, the redirecting idlers, sprockets or flanged wheels, are correspondingly located for a pull through drive system. At the front end of the furnace laterally spaced second redirecting idlers turn the chains upward to the inlet idlers, which redirect the chains back onto the process path, completing the circuit. Optionally, the drive may be positioned anywhere between the inlet and outlet ends of the furnace with appropriate redirecting idler sprockets or flanged wheels and rollers. The chains may be cooled in the cooling section of the furnace and/or on the return path, preferably by induced draft air, or compressed air.

With respect to the high intensity IR flux heating embodiment, (used downstream of a buffer and/or ramp-up zone that raises the temperature of the wafers from ambient to 500° C.-700° C., a HI-IR zone quickly (within about 2 seconds) ramps the temperature to the diffusion process set point within the range of from about 700° C. to about 950° C., while sensitizing the dopant-coated wafer surface(s) by photo-irradiating it/them with high intensity short wavelength IR radiant flux. The high intensity short wavelength IR radiation photo-conditions the wafer surface for faster diffusion. As compared to processes which are long-wavelength radiation processes, this embodiment utilizes short wavelength-IR radiant flux in the diffusion process.

As compared to currently available commercial diffusion furnaces, the inventive embodiment employing one or more zones of high intensity IR flux involves a step of photo-conditioning the wafer surface, which shortens the diffusion processing time by half or more, with the resulting throughput being double or greater. By way of example, in operation, the inventive furnace can complete diffusion processing in 6 minutes, as compared to the currently conventional process in rates of 12-14 minutes. As a result, the throughput is double or greater. In addition, the resulting resistivity of the cell p-n junction layer is not only more uniform across the wafer, and consistent from wafer to wafer, but also lies in the "sweet spot" of between 45-100 ohms/cm$^2$.

It is an important aspect of the inventive rapid diffusion process that where IR lamps are employed, they are operated at a substantially higher power than conventional furnaces, as a % of maximum lamp-rated power. For control of power to the lamps, several alternative control modes may be employed. In a first embodiment, the controller employs an experience-based algorithm to adjust power to the lamps in each zone and top vs. bottom, in accord with a preset desired temperature, by voltage control only. In a second embodiment, the temperature in each respective zone is monitored by thermocouples, and the voltage to the lamps is adjusted via a feed-back loop control algorithm. In addition, the voltage is monitored to insure excess voltage is not supplied to the lamps in the event of thermocouple failure.

In conventional static, rotating-roller furnaces, lamps are operated at from 5-20% power, once the process zone is at temperature, due to the inability to remove significant amounts of heat from each specific zone, since the rollers are static and have high thermal mass. This means the lamp output must be reduced to maintenance levels, thereby reducing the radiant flux. Lower power to the lamps also results in a significant shift of radiant output, to a mix (or suite) of longer wavelengths. The combined lower radiant flux and longer wavelength mix results in little if any photo-conditioning of the wafers. Thus, current static, rotating-roller, thermal diffusion furnaces are characterized by lower flux and longer wavelength without effective photo-conditioning.

In conventional metal mesh belt furnaces, heat removal is not as much a problem. The upstream zones can operate at higher power due to the need to heat the belt, but downstream zones will be operated at lower power levels due the belt already being at temperature. The major problem with metal belts, however, is metallic ion contamination of the wafers since they rest directly on the metal mesh or on metal "pips" incorporated in the belt. Even using ceramic bead-coating on the metal mesh belts, a metal ion cloud still boils off the mesh metal of the belts, adversely affecting the solar cell layer chemistry.

Attempts have been made to coat the bottom of the wafers with a P dopant to reduce the metal contamination from metal mesh belts. However, this results in creating a p-n junction layer on the bottom of the wafer. In turn, this requires an extra process step of etching-off that bottom p-n junction layer. That etching step is typically a batch process, which takes additional time, slowing production. Indeed, this back etching problem was a major incentive to development of solid, high mass static, ceramic, rotating-roller systems.

These problems are addressed and solved by the inventive low mass ceramic tube transport system. First, the metallic transport components, bands or chains, are placed at the sides of the furnace zones and these components are configured to be shielded from element radiation [heat], which prolongs component life. Second, the transport cross wires are completely shielded within low-mass ceramic tubes, which are non-rotating ceramic supports in minimal contact with the wafers. The shielded driven band or chain elements, in combination with wafer support wires being shielded by ceramic tubes, assures a clean atmosphere, making the firing zone substantially free of metallic ion contamination. Third, the ceramic tubes are, in total, much lower mass than rollers and, while non-rotating, are also active, i.e., moving into and out of the furnace, so there is no large, static thermal mass requiring power scale-back. Further, since the ceramic tubes are suspended on wires, if the ceramic tube cracks vertically, it is retained on the wire and the furnace need not be stopped immediately for replacement. In contrast, in solid roller furnaces, when a roller breaks, the furnace must be stopped. Finally, the wafers are not in contact with the ceramic tubes, being raised above them on ceramic rib stand-offs which preferably are configured to only support the wafers at the edges.

In contrast to the 5-20% operating power level of the above-described conventional, currently available thermal diffusion furnaces, in the inventive process embodiments employing IR lamps, they are operated at 40-70% power, or greater. This is made possible by use of HI-IR lamp modules in combination with an ultra-low mass active transport system, so that there is little static conveyor thermal-mass contribution to the process operation.

As a result of operating at twice or greater power, the lamp IR flux in the inventive system using HI-IR modules is substantially higher, and the peak is kept in the short IR range of below about 1.4 microns. The IR wavelength peak of the inventive process is at about 1.25 microns. The relative intensity developed by the IR lamps in accord with the inventive process is some 4-5 times greater than in conventional thermal diffusion furnaces described above. Any fall off of heat in the two side lanes, e.g., lanes 1 and 5 is avoided by the use of the longitudinal resistance heating elements encased in quartz, ceramic or stabilized SiC tubes.

In addition to the conventional furnace operations having far lower IR intensity, the peak in conventional processes is broader, shallower (lower intensity) and shifted to longer wavelengths, having a maximum at about 1.75 microns, but having substantial contribution at the long wavelengths in excess of 3.0 microns. Thus, the lower power operation of conventional IR lamp furnaces shifts the spectral profile to lower energy wavelengths, and reinforces their thermal-conduction operational model. In contrast, the high power, high intensity, short wavelength IR spectral profile of the lamps used in the inventive process confirm the radiant flux nature.

As noted, the inventive furnace in some embodiments employ HI-IR lamp modules, including optionally isolation type modules, in the Ramp Up or/and HI-IR Furnace Zone(s). The modules comprise insulating reflector elements having parallel transverse (to the direction of transport) channels, centered in each of which channels is/are one or more IR lamp(s). The channels are optionally covered with an IR-transparent transmission window, such as quartz, Vicor, Pyrex, Robax, other high temperature glass, synthetic sapphire, and the like. The high intensity, multi-IR lamp, isolation modules are disposed facing each other and spaced apart, one module above the furnace conveyor transport system, and optionally one module below, to define the selected IR lamp-heated process firing zone between them, from which zone the module lamps and cooling air channels are isolated.

The IR-isolation of the lamps, implemented by the cooling/reflector channels and the optional use of a window, prevents adjacent lamps from heating each other. The channels have a wide range of cross-sectional geometries, including square, rectangular, triangular, semi-circular, parabolic, or they form partial pentagonal, hexagonal, octagonal or ellipsoidal forms. The channel geometry is selected to direct the IR radiant energy toward the wafer product traversing the zone on the moving furnace conveyor belt, rather than heating adjacent lamps by direct radiation. Where the window is used, the channels are preferably open at their opposite ends for inlet, or/and exhaust of cooling gas flow. Cooling gas is introduced at least at one end of each channel via a manifold, and is exhausted at the other end, or medially of the ends.

The cavity, or channel-configured, reflector element may be spaced from, or placed in tight contact with, the IR transmission plate "window" to form the isolation cooling channels which maintain the cooling air in close proximity to the lamps for good heat transfer. The transmission plate keeps high pressure/high velocity lamp-cooling air/gas from entering and disturbing the process region through which the transport system carrying silicon wafers pass, while at the same time permitting large quantities of cooling gases to be used to maintain adequate cooling of the lamp quartz as well as the glass/quartz transmission plate. This is important, as most high temperature glasses such as "Robax" are only usable to about 970° C. and quartz starts softening at 1000° C. Therefore by isolation and cooling, this invention permits operation of the IR lamps at power levels that would normally cause the lamp casings to soften and warp, which otherwise results in shortened life spans.

In another embodiment, the isolation module comprises spaced-apart IR lamps with or without channel reflectors, and having the Robax-type glass window spaced below the lamps, so the windows (above and below) isolate the conveyor (carrying the wafers) from the lamp spaces.

This isolation geometry, plus optional cooling of the inventive IR lamps permit increasing the power to the lamps from the current standard of 15-20% power density, to the range of 40-70% or higher. This results in increase in the heating rate in the ramp-up and HI-IR firing zone(s) to from about 30° C./sec (conventional furnace) to about 80-150° C./sec, using conventional 100 watt/inch IR lamps. That effectively increases the heating rate by 3x-5x greater than that of conventional furnaces, yet without resulting in lamp turn down, shut down or deformation. In addition, the inventive lamp isolation/optional cooling system permits increasing the conveyor belt speed. That results in a substantial increase in yield, or permits shortening the length of the furnace (for the same yield) which reduces the furnace footprint.

By way of example only, whereas currently available conveyor diffusion furnaces need 12-25 minutes at temperature to accomplish the diffusion operation, the inventive high-IR flux system can complete the process in 4-10 minutes. The current furnaces are wide (24-36" wide belt) and long (300-400" long), operate at conveyor speeds of about 30-40"/minute. In contrast, the inventive furnace belt is 15-24" wide, the furnace length 200-300" long, and the transport system rate is in the range of about 60-100"/minute for the same productivity (on average, 1200 wafers/hr). From 2-6 lamps are used in each HI-IR isolation module, which has a length of from about 6" to about 12". That is, for exemplary front-side P diffusion, a furnace in accord with the principles of the invention can have a narrower footprint, yet by virtue of greater rate of operation, has the same throughput as wider furnaces.

In order to maintain high flux via high lamp power density in the Soaking Zone for P diffusion, to achieve high speed processing, heat is removed from the zone. Heat removal is implemented in the inventive furnace by the active ceramic tube transport system (a very minor percentage) and by introduction of filtered cooling air (the major percentage of heat removal). The cooling air flow is from top to bottom in the Soaking Zone to suppress deposit of particles on the top surface of the wafers and to remove the particles. Thus, in contrast to high mass, static, ceramic, rotating-roller conveyor systems wherein the processing approach is to not remove heat from the processing zone(s), in the inventive system and process, heat is removed in order to be able to maintain high power density, and permit high flux, short wavelength IR wafer photo-conditioning, thus speeding the process. Recall that heat is also removed from the HI-IR Zone by the cooling air flow through the isolation lamp module channels. While heat removal seems counter-intuitive, the high flux, short wavelength IR more than compensates for heat removal.

Power to heating elements, whether IR lamp or resistive (SiC) radiant elements, top and bottom, is adjusted independently or in groups to achieve precise temperature gradient control in each zone. Temperature control may be effected using either thermo-couple-based temperature regulation, voltage-controlled power regulation, or hybrid systems, employing a PID controller as described above. Regulation of power to the lamps is preferably voltage-controlled, as it permits ease of maintaining stable lamp power for the preferred high values of IR intensity (radiant flux), and constant spectral output at all times. In addition, running the lamps at higher power density increases the IR flux and also provides a better spectral range, with the peak in the proper position.

Accordingly, the inventive diffusion furnace employing ultra low mass transport system permits rapid diffusion firing, in which the resistance element heating or/and IR lamp radiant flux heating, with spectral profile peaking at 1.25 microns throughout the entire process, drives diffusion of P or/and B atoms into the Si (or other advanced material) matrix to form the p-n junction or/and B-diffused back contact surface layers. The heat is directed to the wafers, not the transport system.

With respect to the co-diffusion process utilizing the inventive transport system, an exemplary processing line is configured as follows: 1) Wafers are oriented bottom side surface facing upwardly; 2) B-dopant is applied to the upwardly facing bottom side surface of a wafer and dried; 3) the wafers are flipped, e.g., with a rotary flipper, so that the top side surface of the wafer is now facing upwardly; 4) P-dopant is applied to the top side surface of the wafer and dried; 5) the co-doped wafers are transferred into the inventive diffusion furnace; 6) the wafers are co-fired in the furnace in one pass, cooled, and transferred to downstream ARC, paste screen printing, drying and metallization operations. Because the inventive low mass transport system does not shield the bottom side of the wafers to any appreciable extent, the bottom side is properly fired so that B diffusion takes place for subsequent formation of the back contact layer.

Transport Fail-Safe System:

As a furnace option, the lower half of the furnace can be provided with sag-arrester assemblies that function to prevent excess sag of the suspension wires or rods that carry the ceramic tubes and stand-offs, in the event that they fail, e.g., by breakage of the wires or elongation under stress or heat. In a presently preferred embodiment, the sag-arrester assemblies comprise slider members, e.g., selected from quartz tubes, rods or strips, that are aligned parallel to the center line of the conveyor transport path, which is coordinate with the longitudinal center line of the furnace heating zone. The arrester slider members are spaced inwardly from the side walls of the furnace chamber a distance that brings them into alignment with, and spaced below the path of travel of the standoffs. Each longitudinal end of an arrester slider member is mounted, e.g., in a transverse wall of the furnace firing zone, so that the top of the slider member is above the top of the transverse wall. Thus, if and when a transport wire and tube assembly sags, the standoffs will contact the slider member, slide along it as the transport advances, and clear the furnace transverse walls without snagging and breaking, or otherwise damaging the transport system. For example, the spacing between the top of the arrester slider member and the bottom of the standoff may be on the order of 1-2 cm. Further, since the arrester slider members are spaced in alignment with the paths of standoffs, they do not shadow the wafers, being off to the sides of the wafers.

Side Wall Heating of Outer Lanes:

In the presently-preferred heating system, transversely oriented IR lamps are used in the upper heating zone(s), and a combination of IR lamps and resistance heating is used in the lower heating zone. To improve lateral heating uniformity across the width of the furnace, resistance heaters are placed adjacent the two longitudinal side walls oriented parallel to and spaced apart from the centerline of the furnace, while the IR lamps are placed transversely above or below the longitudinal side wall resistance heating elements, preferably below. The longitudinal side wall resistance heaters are disposed in, and supported by, quartz, ceramic or stabilized SiC tubes disposed just below the conveyor. In a 5-Lane or wider furnace they serve to keep the wafers in Lanes 1 and 5, the outer lanes adjacent the respective side walls, at proper diffusion temperature. This is particularly useful in co-diffusion processing.

The side wall heaters function to trim the temperature of a furnace adjacent the side walls, as IR lamp heating elements stop just short of the side wall to keep from causing lamp burn-out. Were the IR lamp heating elements to extend into the side wall insulation, the insulation would result in the local temperature of the lamp to exceed safe operation value. The resistance-type longitudinal side wall heaters do not glow like the main transverse IR lamps; rather, they operate at lower power levels to adjust the temperature of the area near the side walls, i.e., the edge temperature, up sufficiently to compensate for lost power at the lamp ends, and any losses through the side wall insulation to the exterior of the furnace.

As a result of the lower power operation, the longitudinal heaters can be placed above the level of the primary IR lamps and close to the side walls, typically from about 1-5 cm. They are also place slightly below the conveyor plane; in the case of a diffusion furnace using the inventive low mass transport system, on the order of 1-3 cm below the level of the ceramic tubes that comprise the wafer transport support elements.

Exemplary side wall heating elements comprise coil resistance heating elements encased in an Inconel sheath and insulated from the sheaths by MgO powder. They are then inserted in quartz tubes which may be transparent, translucent or opaque; since the elements may not necessarily "glow" in or near the visible spectrum depending on the required output power, the clarity of the carrier tube is not a significant issue. In addition, use of the carrier tubes provides an important safety feature in that they act as an electrical shield or insulator against electrical shock. Other types of heating elements may be used as the longitudinal side wall heating elements including a simple air coil of Nichrome wire drawing 1-3 kW introduced into a carrier tube. The side wall heating elements are controllable by standard SCR controllers.

BRIEF DESCRIPTION OF THE DRAWINGS

The invention is described in more detail with reference to the drawings, in which:

FIG. 6 graphically illustrates that spectral output is the key to IR lamp-heated diffusion process speed, with FIG. 6A showing the Spectral Output in the inventive low mass transport system in terms of relative intensity vs. wavelength, and FIG. 6B shows the comparative Spectral Output in a high mass, solid ceramic roller system in terms of the same relative intensity vs. wavelength;

FIG. 9 is an enlarged isometric of details of the chain drive showing how the suspension wires and ceramic tubes are journaled in hollow chain tubes;

FIG. 12B is an isometric view of an inventive diffusion furnace bottom section which has been fitted with a pair of sag-arrester sliders;

FIG. 13 is a schematic drawing of a process line for co-diffusion of both B and P into wafers as part of the processing of Si wafers into solar cells;

DETAILED DESCRIPTION, INCLUDING EXEMPLARY MODES OF CARRYING OUT THE INVENTION

The following detailed description illustrates the invention by way of example, not by way of limitation of the scope, equivalents or principles of the invention. This description will clearly enable one skilled in the art to make and use the invention, and describes several embodiments, adaptations, variations, alternatives and uses of the invention, including what is presently believed to be the best modes of carrying out the invention.

In this regard, the invention is illustrated in the several figures, and is of sufficient complexity that the many parts, interrelationships, and sub-combinations thereof simply cannot be fully illustrated in a single patent-type drawing. For clarity and conciseness, several of the drawings show in schematic, or omit, parts that are not essential in that drawing to a description of a particular feature, aspect or principle of the invention being disclosed. Thus, the best mode embodiment of one feature may be shown in one drawing, and the best mode of another feature will be called out in another drawing.

All publications, patents and applications cited in this specification are herein incorporated by reference as if each individual publication, patent or application had been expressly stated to be incorporated by reference.

Figure 1:
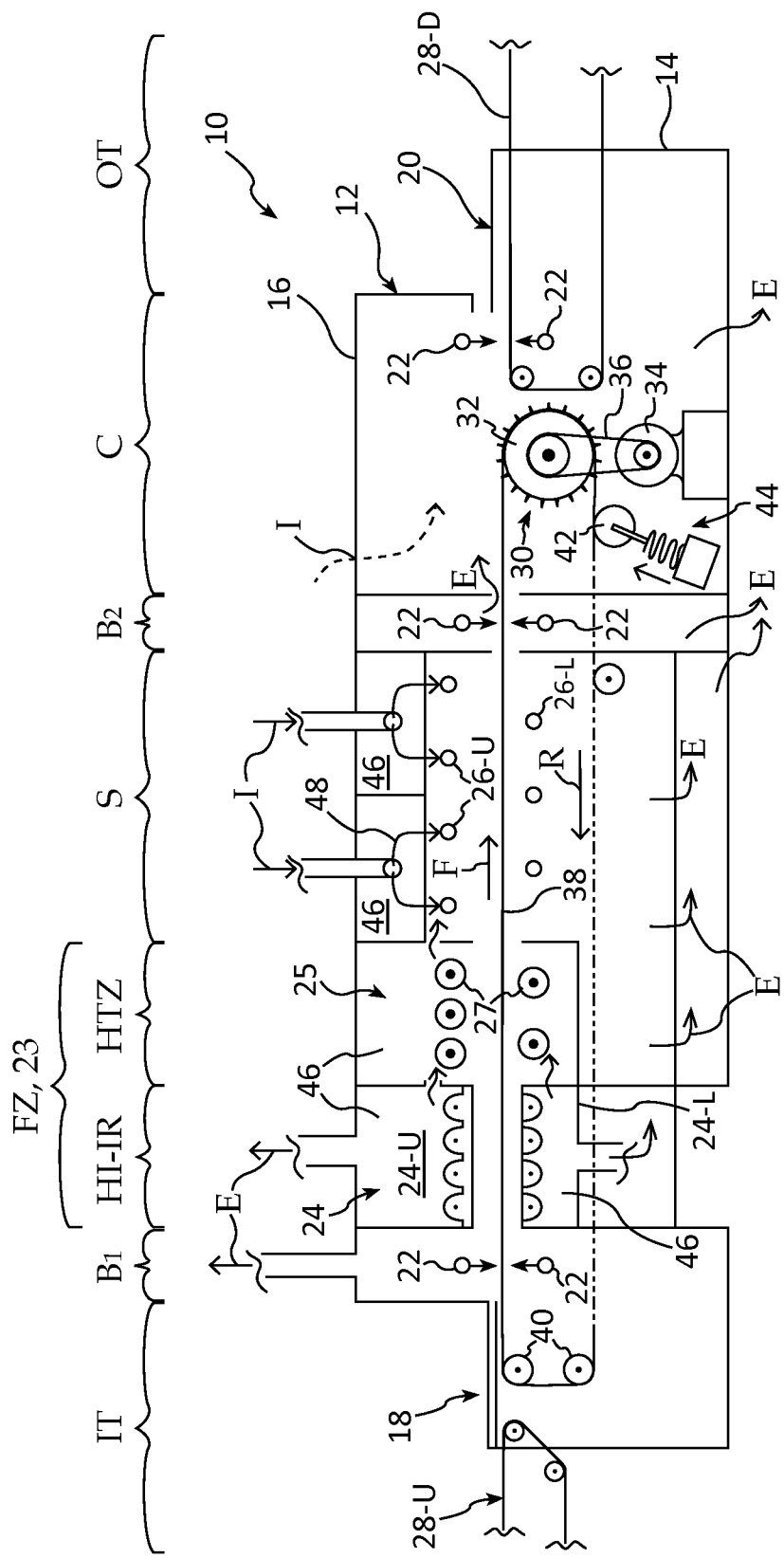
FIG. 1 is a schematic of a first embodiment of the inventive diffusion furnace showing in side elevation the Inlet Transition Zone, a Baffle Zone or/and Ramp-Up Zone, a optional Firing Zone, at least one Soaking Zone, a Cooling Zone and a low mass drive system.

FIG. 1 is a schematic diagram of the inventive diffusion furnace 10 which comprises a framework and housing 12 having a lower section 14 and an upper section 16, the framework 12 optionally being configured with linear actuator lifts spaced along the exterior (see FIGS. 2 and 3) to raise the upper section 16 relative to the lower section to permit servicing of the lamp assemblies and the transport system. The furnace 10 comprises a plurality of sections or zones as follows, from the entry or front end 18 (on the left in this figure) to the outlet or back, downstream end 20 (on the right):

IT, the Inlet Transfer end 18 from an upstream dopant applicator unit (not shown);

B-1, Inlet Baffle Zone employing one or more compressed air knife assemblies 22; optionally the B-1 Zone comprises a Ramp-Up zone containing one or more heating elements (not shown) to raise the wafer temperature from ambient to around 500° C.;

FZ, the initial Firing Zone for raising the wafer temperature to the diffusion temperature in the range of from about 900° C. to about 1100° C. depending on whether P, B or both are diffused; the FZ can further be subdivided into two or more zones, e.g.;

HI-IR Zone, High Intensity IR lamp array, preferably upper or/and lower isolation reflector lamp assemblies 24-U, 24-L for temperatures up to about 950° C., followed by;

HTZ, High Temperature Zone, heated by resistance radiant (SiC) elements 27 for temperatures up to 1100° C. depending on whether P, B or both are diffused;

S, Soaking Zone(s), having spaced upper and lower IR lamps or resistance elements, 26-U, 26-L;

B-2, Exit Baffle Zone with air knife assemblies, 22;

C, Cooling Zone, typically with no element or IR lamps; and

OT, Outlet Transfer Zone for transfer of the diffusion fired wafers to the processing equipment for screen printing collector fingers and busses on the front side and the back contact layers on the back side (not shown), which is followed by firing to form the ohmic contacts. The Outlet Transfer Zone may optionally include upper or/and lower air knife assemblies adjacent the exit of the furnace (on the right).

Upstream and downstream of the inventive furnace are low temperature transfer belts 28-U (Upstream) and 28-D (Downstream), typically, elastomeric (O-ring) belts on the upstream end from a doping coating applicator assembly, and wire mesh belts on the downstream end to an anti-reflection layer applicator, a screen printer and thence to a metallization furnace. These low temperature transfer belts 28-U and 28-D interface with the drive system 30 of the inventive furnace 10.

The inventive furnace low-mass drive system 30, in a first embodiment, comprises a pin drive roller 32, driven by a motor 34 and chain or belt 36 disposed at the outlet (right) end of the furnace, wafer transport band assemblies 38, idler rollers 40 and a tension system 44 which includes a tension roller 42. The tension system 44 includes an automatic tension compensator spring acting as a dashpot to assist in preventing surges. Note that by this drive geometry, the bands 38 are pulled along the feed path, F, through the zones from left to right. This is implemented by the drive assembly 30 pulling the upper level bands from left to right (as indicated by Arrow F—forward).

The inventive furnace includes a plurality of plenums defining the Zones interior of the housing 12, and a plurality of air manifolds, including inlets and exhausts for ambient or pressurized air flow into the various Zones as shown by the arrows I (for Inlet), and E (for Exhaust), in order to maintain the proper temperature in the respective zones. In addition, pressurized air is provided in the channels of the reflector body of the isolation lamp assemblies 24-U and 24-L (where used) to cool the lamps disposed in the channels. The face of each of the high intensity lamp assembly 24-U and 24-L is covered with a sheet of clear quartz to seal the reflector channels from the wafers being photo-conditioned in the HI-IR zone. This insures the air stays in the annulus between the contoured reflector surface and the lamp to provide the necessary cooling. That is, the lamps are isolated from the processing zone. By way of implementing example, the air is introduced at each end of the lamp (the sides of the furnace), and exhausted out an outlet in the middle, that is, along the vertical centerline of the furnace. This lamp cooling permits the lamps to be run at from about 60% to 100% of maximum power, which is far higher than presently available competitive units. This provides an immediate thermal boost and high intensity IR irradiation of the wafers from ambient temperature to the peak diffusion conditioning temperature of 700° C. to 950° C. (for P diffusion), and the high intensity photoconditioning.

FIG. 1 is of such scale that the solid thermal insulation material 46 cannot be shown in every position, but it will be evident to one skilled in this art that the housing includes necessary configured blocks of insulation material. For example, in the Soaking Zone, the blocks of insulation include a transverse bore and a vertical inlet bore connected to the inlet air pipe so that pressurized air is fed into the block, and air can pass evenly through the porous insulation material to provide a controlled flow into the Soaking Zone, thereby maintaining the temperature in the required range, while minimizing the energy costs. That is, there is a counter-flow of air (shown by arrows 48) through the insulation into the zone which is opposite the heat flow. This results in the air, as it enters, picking up heat from the insulation and recycling it into the zone. The result is a highly efficient heat exchange operation for this zone. Note the lamps 26-U and 26-L or resistive elements 27 are shown staggered to provide an even heating and/or IR photo field, but they are optionally arranged not staggered, that is, the lamps/elements can be located spaced one above another in a common vertical plane.

Figure 2:
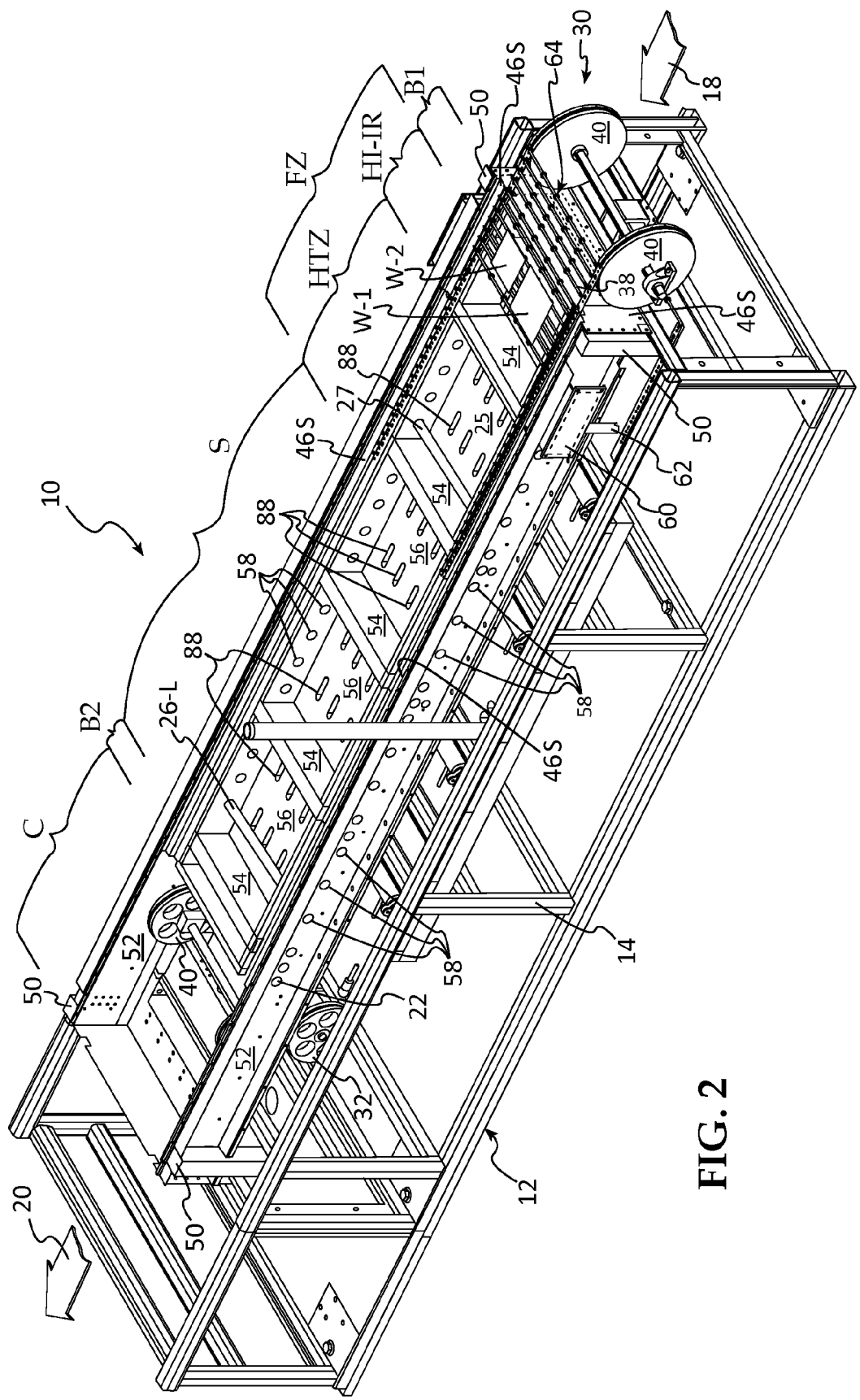
FIG. 2 is an isometric view of the inventive low mass transport system, in this embodiment a band-type transport, as mounted in several of the heating zones of a diffusion furnace with the front, inlet end of the furnace being on the right, and also showing wafers on the alumina support tubes.

Turning now to the low mass transport system 30, FIG. 2 shows in isometric view the furnace 12 with the outer panels and insulation removed to show the frame of the lower section 14. The inlet end 18 is at the lower right, and the outlet end 20 is at the upper left. The inlet transfer belt 28-U and outlet transfer belt 28-D are not shown for clarity. Also for clarity, the brackets and lifters 50 are shown at the four corners of the furnace side rails 52; these function to lift the upper section 16 (not shown) from the lower section 14 (shown) for ease of inspection, adjustment, maintenance and repair/replacement of parts, e.g., lamps, resistive heating elements, transport system elements, and the like. The lower section 14 includes side rails 52, sidewall insulation blocks 46-S, and internal zone divider blocks of insulation 54. The forward insulation block at the front end of the Baffle Zone B-1 and dividing B-1 from the High Intensity IR zone HI-IR, and at the aft end of the cooling zone C are not shown in order to not obscure details of the band 38.

FIG. 1 also shows the insulation blocks 56 forming the floor of the several zones. These floor insulation blocks 56 typically are provided with apertures, here slots 88, which together with a plenum below the floor (not shown) permit extraction of hot exhaust gases by an ID fan (not shown). This airflow removes heat from the individual zones, permitting the elements (lamps, SiC rods or coils) to be run at higher output, and also provides for contaminant extraction since the airflow is from top to bottom. This hot gas/airflow pattern results in the furnace zones having reduced contaminant levels, and therefore a cleaner product.

Apertures 58 for installation of the resistive elements 27 or/and high intensity lamp tubes 26 (only one of each being shown for clarity) and connection of the electrical leads are shown in the facing side rail 52 and the far sidewall insulation blocks 46-S, the elements/lamps spanning the width of the furnace zones. The compressed air plenum 60 for the lower High Intensity IR lamp zone 24-L feeds compressed air via line 62 into the annulus between the reflector channels and the lamps, and is exhausted below to the exterior, or into the adjacent, downstream Soaking zone, as needed.

For clarity, only a portion of the low mass, active transfer belt system 30 is shown at the right end. The side bands 38 engage pins in the spaced idler rollers 40 of the drive system 30. Just inside the Cooling zone, C, the idler roller 40 and the drive roller 32 below it can be seen. Two wafers, W-1 and W-2 are shown at the inlet end (on the right) placed on the transverse alumina tubes 64 in the position of transfer through the furnace.

Figure 3A:
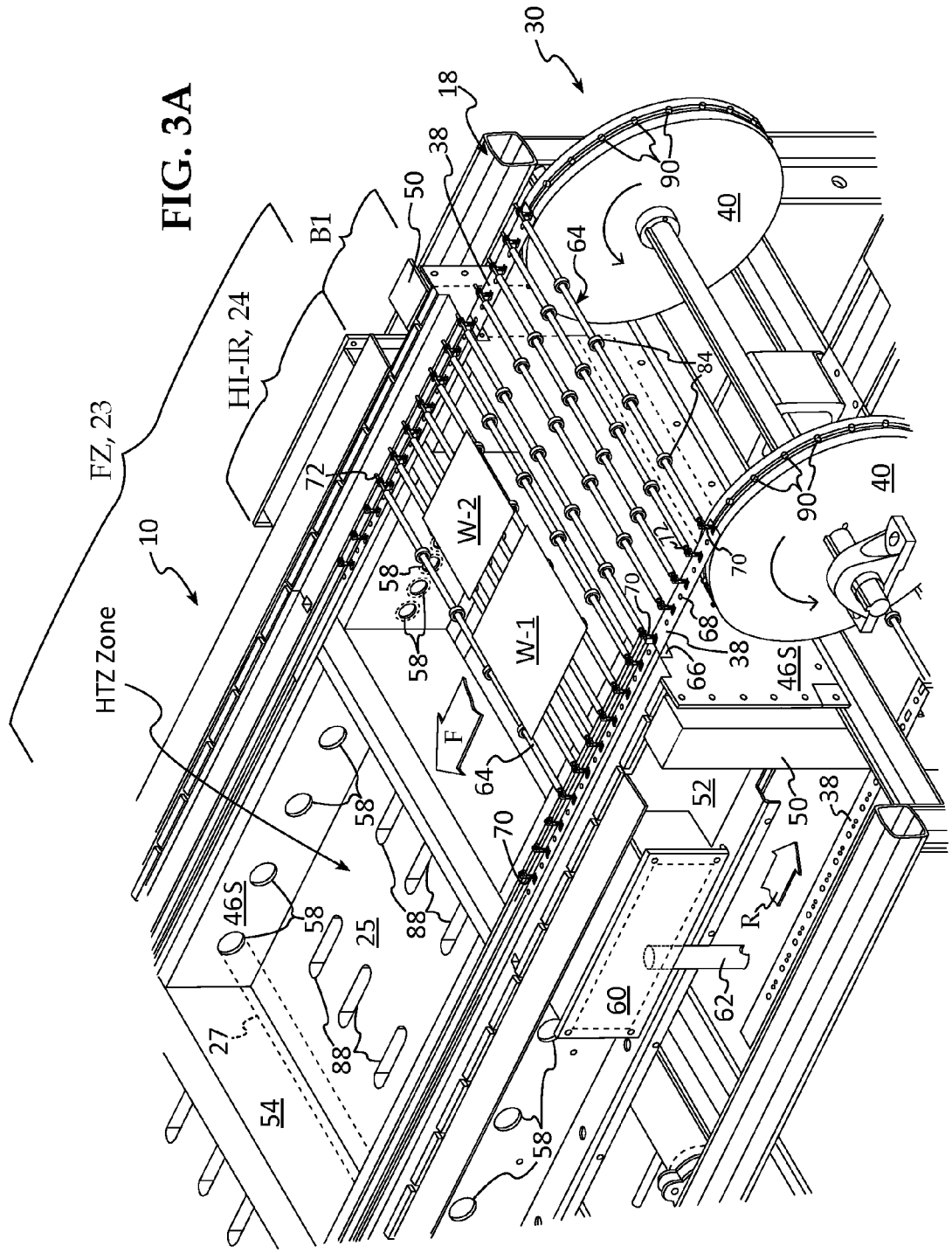
FIG. 3A is an enlarged view in isometric of the band transport embodiment of FIG. 2 in the inlet baffle zone and an optional HI-IR lamp zone showing transport of two exemplary wafers through the furnace.

FIG. 3A is an enlarged isometric view showing the inlet end 18 of the inventive furnace 10 of FIG. 2 showing a portion of the band transport system 30 carrying two wafers W-1 and W-2, the numbering of parts and elements being the same as in FIGS. 1 and 2. The two spaced bands 38 of the transport system 30 are disposed in U-shaped channels 66 formed into the tops of the left and right sidewall insulation blocks 46-S. Each band includes precisely spaced holes 68 that engaged pins 90 of the idler rollers 40. Also spaced regularly along the bands are up-standing pylons 70 which carry wires 72 on which are placed ceramic tubes 64. An exemplary wire is 0.080" diameter Nichrome. The wafers rest on the ceramic tubes. Preferably standoffs 84 are provided, here rings in this embodiment, mounted, on or formed into, the tubes and spaced laterally apart along the tubes. The wafers rest on the stand off rings during transport through the furnace 10, so that there is minimal contact of the wafer back surface with the transport assembly elements, see footprint 96 in FIG. 4A.

In the event a tube 64 breaks or cracks, it will be retained by the wire 72 until it can be replaced. The pylons of each band move in parallel coordinate relationship due to the indexing of the holes 68 in the band with the pins 90 of the rollers, (drive and idlers), thus the alumina tubes remain transverse to the direction of wafer feed travel, as shown by the Arrow F. A plurality of photo-optical band-break sensor(s) are used, typically one at each end of each band, to quickly sense if a band breaks to signal the controller to stop the transport system, shut down the lamps and sound an alarm.

Figure 3B:
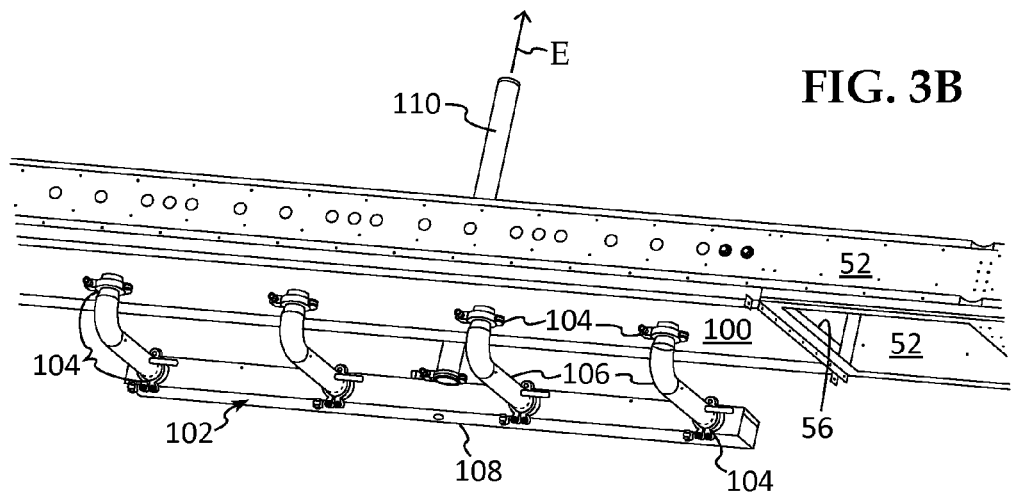
FIG. 3B is an isometric view from underneath the lower section showing the exhaust manifold for a Soaking Zone.

FIG. 3B is an isometric from underneath the lower section 12 of the furnace with the framework removed for clarity. The side frames 52 are spanned by the floor insulation blocks 56 having exhaust slots 88 (best seen in FIG. 3A). Spaced from the bottom of the insulation blocks 56 is a steel panel 100, the space providing a collector plenum for the hot gases. An exhaust manifold assembly 102 is connected to the plenum (space between 56 and 100) via collars 104 on the ends of cross-pipes 106. The opposite end of the cross pipes are connected to a collector duct 108, which exhausts the hot gases out an exhaust pipe or flue pipe 110. The venting may be implemented in any suitable way, e.g., by forced air into the furnace at the top, by induced draft in the exhaust path, by natural flue (chimney) effect, or by an eductor effect, such as wherein compressed air is fed into the periphery of a venturi to form a vacuum that sucks hot air out of the furnace.

Figure 4B:
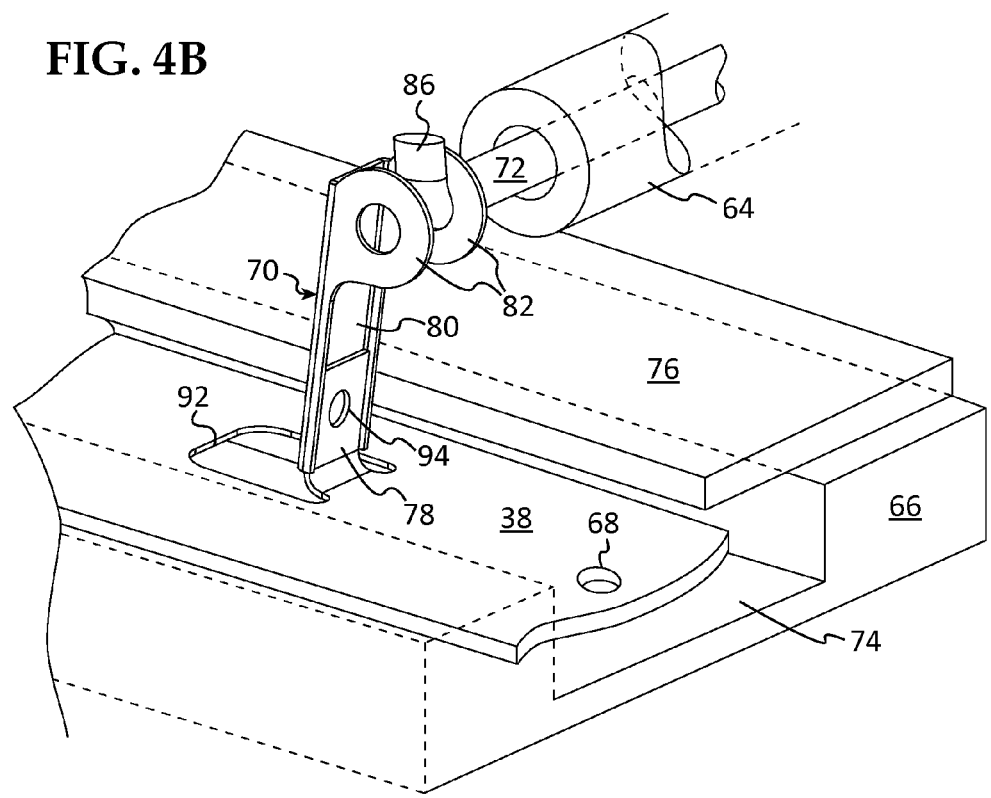
FIG. 4B is an enlarged isometric view of the pylon assembly and the bent wire tip retainer for the band transport embodiment.
Figure 4A:
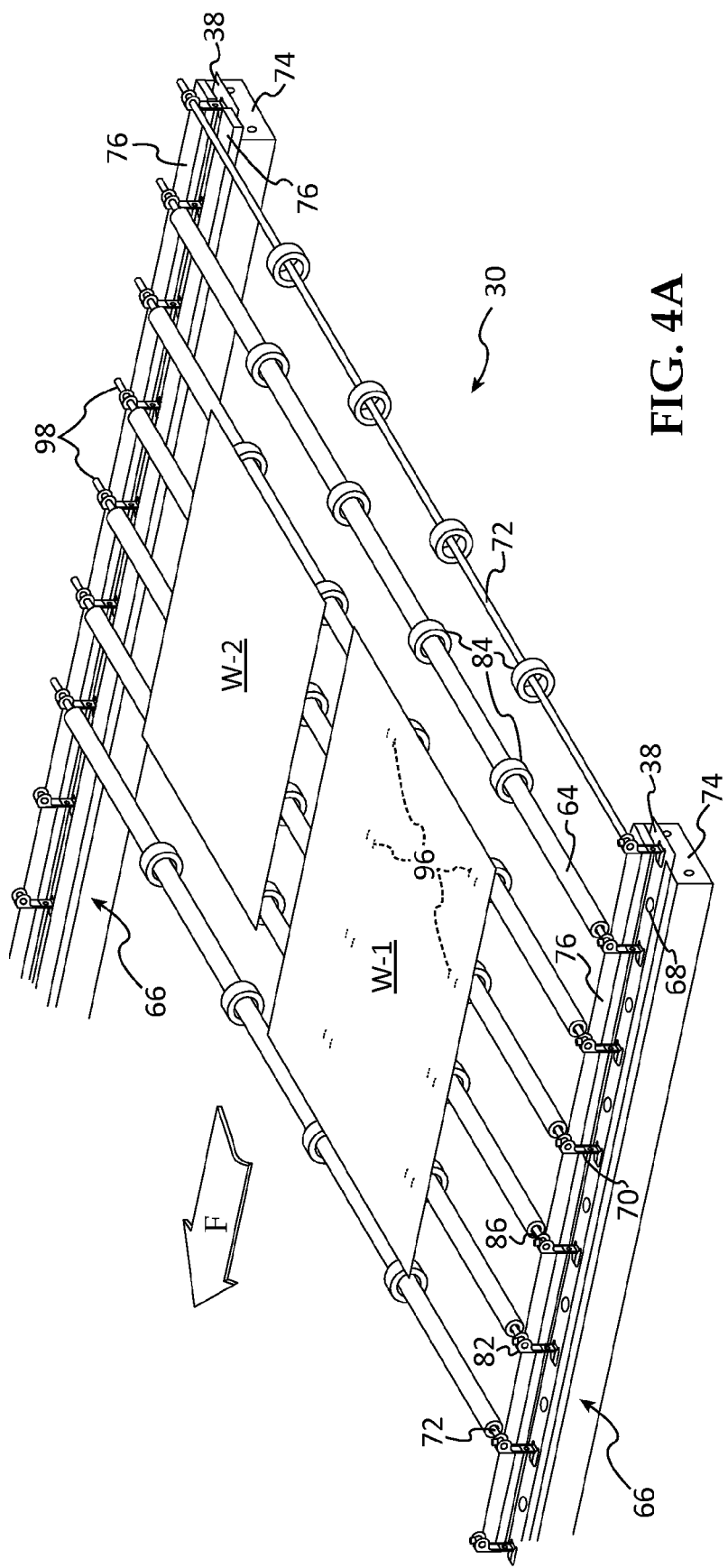
FIG. 4A is an enlarged isometric view of the band transport exploded out of FIG. 3A to show the details.

FIGS. 4A and 4B should be considered together. FIG. 4A shows in isometric the low mass transport system 30, and the U-shaped channel assembly 74 in which the bands 38 of this embodiment move, isolated and exploded out of FIG. 3 to show the details of construction and operation. FIG. 4B is a close up of a single pylon assembly of FIG. 4A.

Each band 38 is supported on a quartz slider member 74, U-shaped in cross-section and having short vertical side walls. A pair of keeper strip members 76 made of quartz, alumina, or other high temperature, fiber-type ceramic material are glued to the tops of the U arms with a high temperature ceramic cement, such as #1 Insa-Lute or #2 Aluseal high strength silica or alumina cement of Sauereisen Company of Pittsburgh, Pa. The keeper strips overlap the channel sufficiently to assist in physically keeping the band in the channel and to shield it from the heating elements in the zones, thereby keeping it cool. Optionally, the bottom of the slider members can be bored with holes and connected to an input air manifold so that ambient compressed ambient air can be used to cool the bands.

The pylons 70 include a vertical leg 80 secured to an upright tab 78 that has been formed by punch-out 92 from the band. The leg 80 and tab 78 may be secured together in any suitable manner, e.g. by spot welding, riveting through coordinate tab and leg holes 94, or with screws. The upper end of the pylon leg 80 carries one or more ears 82, a pair being shown by way of example, each ear having a hole into which a high temperature resistant wire or rod 72 is journaled. An alumina tube 64 is slid over and carried by the wire. The wafers, W, are carried on the alumina tubes. Preferably each tube includes a plurality of laterally spaced stand-off members 84, here rings, on which the wafers rest. The ring members present far less surface area for the underside of the wafer to contact, as shown by the footprints 96, shown in phantom in FIG. 4A. This stand-off function keeps the wafers cleaner, and helps concentrate the IR flux or heat radiation onto the wafers.

The stand-off rings 84 may have a wide variety of cross-section configuration, ranging from a simple flat surface torus as shown in FIG. 4A, to a tapered profile, e.g., one that is bell-curve shaped in cross-sectional profile. See FIGS. 10A, 10B, 11A, and 11B for various profiles. Note in FIG. 4B the wire 72 is trapped between the two ears, to prevent lateral movement of the wire such that the other end (right side) falls out of the ears of the pylon on that side. Note in FIG. 4A that the right side of the wire extends well past the outer ear of its respective pylon.

The use of wire having a free end permits the wire length to expand and contract without falling out of the holes in the ears. In addition, at least one end of the wires includes a bent tip 86 which keeps the wire locked in place. While the bent tip can be located beyond the outside ear, it is preferred to have the bent tip trapped between the ears, as shown. This locks the wire from lateral movement, yet is easy to insert by a simple angular insertion through the inside ear hole. The wire at 0.080" diameter fits sufficiently closely in the 0.120" bore of a tube 64 that the natural minor curves of bends in the wire prevent the tubs from sliding laterally. They also act as a stop, preventing the wires from disengaging from the ears.

It is an important feature of the band and chain embodiments of the transport system of this invention that they are ultra low mass, simple to install, easy to keep clean, has few contact points on the wafers while transporting them through the furnace, and is easy to maintain. As to the latter point, it is an option to replace a ceramic tube while the bands are on the return portion of the cycle, without stopping production. However, as seen in FIG. 4A, since there are so many wires sufficiently closely spaced to provide support for the wafers, a broken tube and/or wire normally will be left for replacement at the time of a planned shut-down. That is, loss of a tube or wire does not seriously impact the product throughput.

The ultra low mass aspect of the inventive transport system is very important. In some currently available competitive IR lamp or resistance heating element furnaces, instead of a metal mesh belt, an array of closely spaced, solid, precision machined, relatively large, rotating but static (not longitudinally moving through the furnace) ceramic rollers are used as a roller conveyor system. The wafers ride directly on the rollers which are rotationally powered by drive sprockets or pulleys secured to the ends of each roller driven by a sinusoidal drive chain or belt. Such furnaces are available from SierraTherm, Watsonville, Calif. as its XR Series for in-line diffusion of P dopants into silicon wafers for solar cells. Another rotational, large ceramic roller diffusion furnace is made by TechnoFimes of Milan Italy. In these furnaces, the rollers statically stay in place but rotate to power the wafer movement over them through the furnace. That is the opposite of the inventive system, in which the small ceramic tubes do not rotate, but move through the furnace. However, with respect to the wafers, the ceramic tubes in the inventive furnace are static, that is, they do not move relative to the wafers.

A first serious problem with such roller-type furnaces is the total side edge to side edge, and front edge to back edge contact of the wafer back surface with the entire surface of each and every roller, thus promoting contamination. In addition, the energy required to heat the high mass of the rollers, and to maintain them at temperature, is far higher than in the inventive system. In the inventive band transport system, the ceramic tubes are smaller than the rollers of SierraTherm or TechnoFimes, being typically ¼" diameter vs. 1.5" diameter. The inventive transport uses 0.8 oz hollow tubes having a 0.120" bore, rather than being 3-5 lb solid rods. Thus, the mass of the inventive conveyor system is on the order of $\frac{1}{50}^{th}$ that of the solid ceramic roller system, and the mechanics of transport are far faster, simpler and easier to maintain. To clean the inventive system only calls for a simple change out of a few tubes, rather than scrubbing, grinding, burn-off or change-out of one or more heavy solid rods in the inter-linked solid ceramic roller array of the SierraTherm or TechnoFimes furnaces. The inventive furnaces can be half the width of such conventional roller furnaces and still provide a greater throughput and better yield.

Another problem with solid ceramic rod-type roller systems is the potential for hot-spots, and thereby uneven diffusion. As the wafers move over the rollers, the rollers are intermittently exposed directly to the IR or resistance element radiation, so the leading edge of a wafer repeatedly contacts a hotter roller as it traverses the furnace. In contrast, in the inventive furnace transport system, the wafer, from the very first introduction into the High Intensity IR zone shields, and never moves relative to, the refractory tube stand-offs on which it rests. Since the wafer is spaced by the stand-off above the surface of the small-diameter alumina tube, there is room for hot air to circulate between the wafer back surface and the tube, as well as allowing indirect radiant heating by adjacent heating elements from the front and back (top and bottom sides) to provide radiant energy. Since the inventive tubes are so small, there is no shadowing of the wafers, thus providing more even heating of the wafers. There is also no intermittent exposure to large hot rollers, and less back surface contact with supports, which stay at uniform temperature.

Finally, in the furnace embodiments using high intensity IR lamps or isolation modules adjacent and downstream of the immediate entrance of the inventive furnace, the wafers are extremely rapidly heated (within a few seconds) into or near the diffusion temperature range. In this embodiment, the wafers are photo-conditioned with high intensity short wavelength IR radiant energy, on the order of 4-5 times or more greater than present roller furnaces, so that the diffusion proceeds far faster. By way of example, in the inventive furnace, the temperature gets up to diffusion temperature within seconds. More importantly, by use of the isolation modules in a HI-IR zone, and the ability to power those and Soak zone elements at higher voltage, the IR flux is higher during the process, and diffusion is complete in less than 6-8 minutes, as compared to twice to three times as long with present systems.

Figure 5:
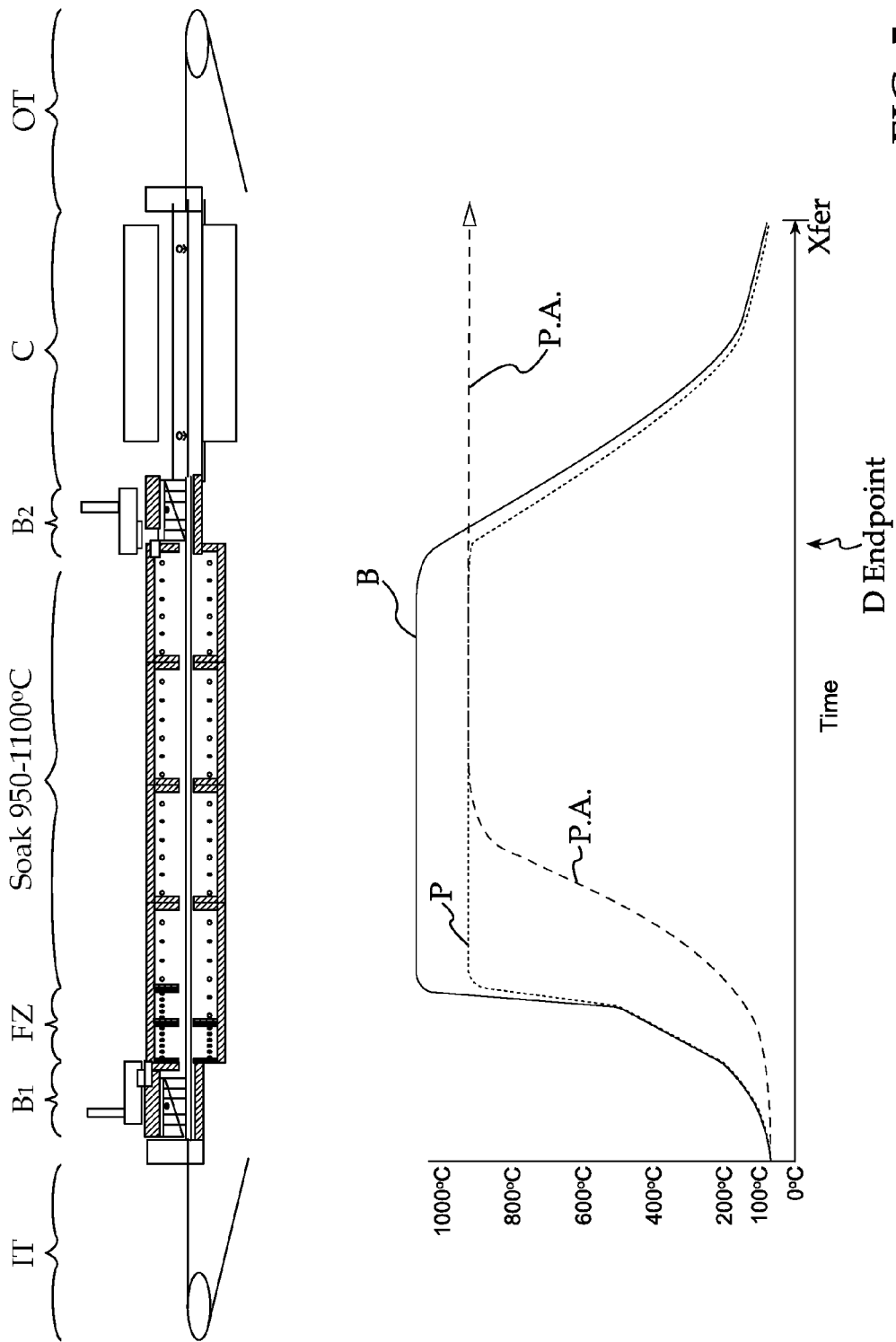
FIG. 5 is a schematic of the inventive furnace in side elevation overlying a graphic profile of the temperature developed in the corresponding zones vs time.

FIGS. 5 and 6 illustrate these principles. The upper portion of FIG. 5 schematically shows the inventive furnace in side elevation overlying a graphic profile of the temperature developed in the corresponding zones vs time. The dotted curve P is the temperature profile in the inventive furnace for P diffusion on the front side to develop the p-n junction layer solely by IR lamp heating. The solid curve shows that B diffusion in the inventive furnace to form the back contact layer proceeds at approximately 200° C. higher and needs at least some zones heated with resistive elements, such as the SiC rods disclosed. Note the extremely steep profile produced by the inventive furnace IR lamps or resistance elements getting the wafers rapidly up to process temperature for P (and/or B) diffusion. The comparative, commercially available solid ceramic roller furnaces using IR lamp heating show a curve for P diffusion generally following the dashed line profile, labeled "P.A." (Prior Art) on the graph. Since the rollers are already hot in the furnace, the lamps are automatically adjusted to run at a lower power (see FIG. 6B, below), thus resulting in a substantially and significantly lower temperature profile slope, and longer time to get to temperature, on the order of several minutes longer. The most significant aspect of this FIG. 5 graph is that with the inventive furnace, the diffusion is done substantially sooner, at point "D Endpoint" on the ordinate, the wafers proceeding to cooling and transfer to screen printing, point "XFER" on the ordinate.

In contrast, the comparative Prior Art P-diffusion process (dashed line in FIG. 5) is continuing to heat-soak far longer at the lower power setting as shown by the arrow pointing right on the dashed line. The inventive high intensity IR radiant flux P diffusion process typically takes ½ to ⅓ the time of conventional thermal conduction process. Thus, the throughput is substantially higher with a much smaller furnace (under 300" long and half as wide), as compared to comparable-output conventional furnaces (400" long by 36" wide).

FIGS. 6A and 6B graphically illustrate that spectral output is a key to improved IR diffusion process speed in photo conditioning, ramp-up and HI-IR zones. Spectral output of a lamp is a function of lamp power, expressed as a percentage of maximum power capacity of the lamp. FIG. 6A shows the Spectral Output curve in the inventive low mass transport system in terms of relative intensity vs. wavelength. The upper curve is the theoretical maximum, T, showing the IR peak at about 1.2 microns with the relative intensity of about 12.5. Note the visual spectrum, VS, is to the left, shown in the dotted lines. The lower curve, labeled "Invention", shows that in the inventive ultra-low mass transport system using Hi-IR lamp modules, the IR lamps can be operated with a lamp voltage control system at from about 40-100% of rated maximum, here shown at about 40-70%, and the intensity maximum at the peak is 8.

In contrast, FIG. 6B shows the comparative Spectral Output in a high mass, solid ceramic roller system in terms of the same relative intensity vs. wavelength. In such a comparative system, run with thermocouple-type thermal monitoring control feedback system, the lamps must be run at about 20% power. However, there is an exponential drop-off in relative intensity, and the peak, labeled "PA", is shifted closer to 1.75 microns, at a peak intensity of about 1.8, which is over a four-fold lower radiant flux than in the inventive process. Also important is the shift to longer wavelength, lower energy spectral profile in the conventional systems.

Thus, in the inventive system, since the lamps are essentially only radiation-conditioning and heating the wafers, the HI-IR Zone lamps and the Soaking Zone are cooled, and there is substantially no heat contribution from a relatively huge mass of rollers, the lamps can be operated at greater power, resulting in a 4-5-fold increase in the relative intensity. This increased IR intensity, applied sooner to the wafers, conditions them to promote the far faster diffusion of P or/and B into the advanced wafer material to form the respective junction and back contact layers. Thus, in the inventive system, the IR intensity is higher and maintained sufficiently long for far faster processing.

Figure 7:
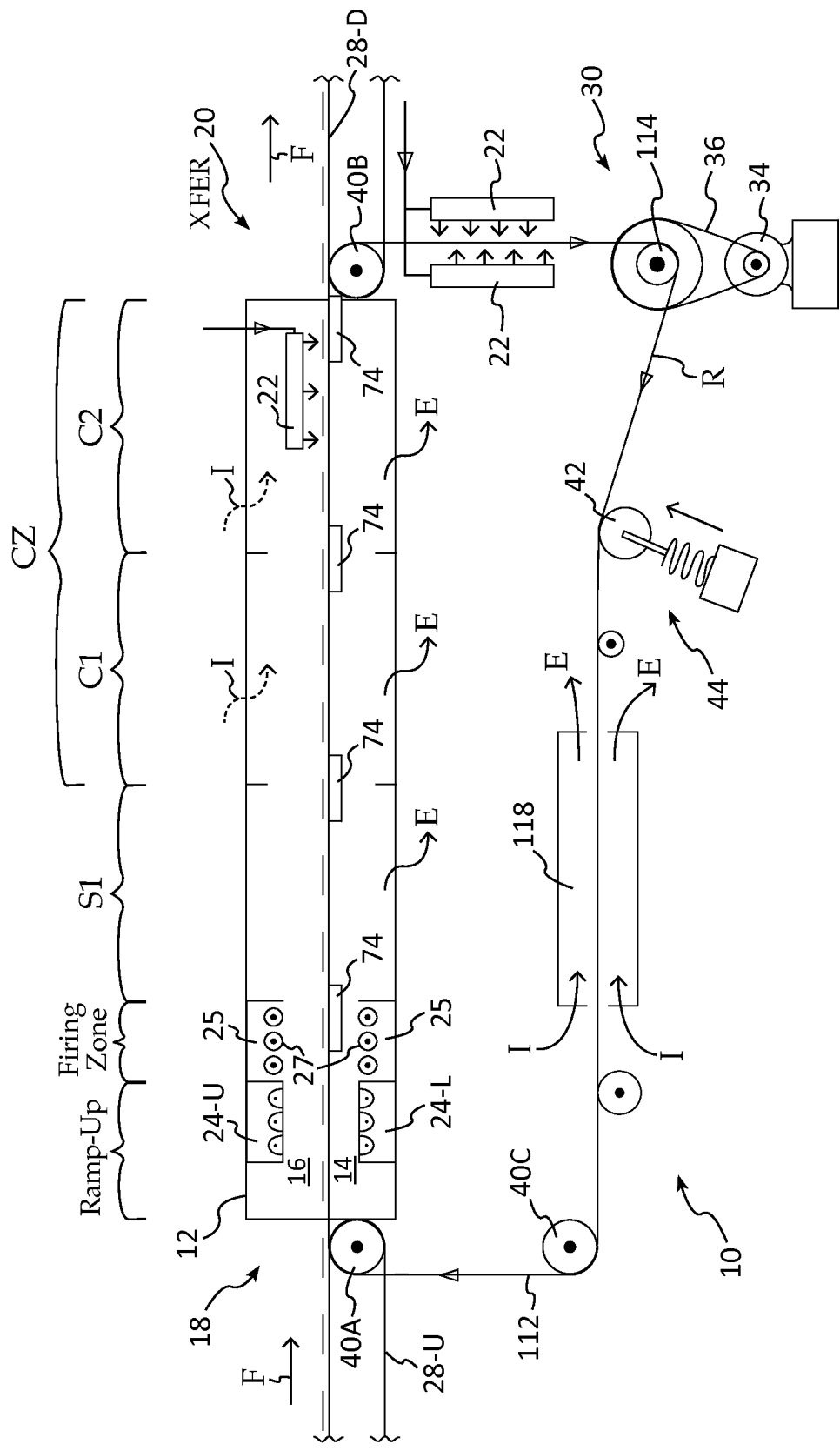
FIG. 7 is a schematic of a second embodiment of the inventive diffusion furnace showing the several processing Zones and chain drive wafer transport system.

FIGS. 7-10B are directed to the second embodiment of the inventive ultra low mass transport system as employing a pair of spaced chains from which the wafer support wires and ceramic tubes are suspended. In FIG. 7, the description above for FIG. 1 applies for the parts numbered the same. Note that the IT and B1 zones are combined in this embodiment into a Ramp-Up Zone wherein the wafer temperature is raised from Room Temperature to about 500° C. to 900° C., the latter where the Ramp-Up Zone includes a HI-IR isolation lamp module. This is followed by the Firing Zone which raises the temperature to the diffusion processing temperature of about 950-1100° C., dependent on if P, or B, or both, are being diffused. As shown, the Firing Zone employs the disclosed exemplary resistive SiC elements. Firing set point temperature is retained in the Soaking Zone, the heating elements not being shown to prevent cluttering the drawing, but see FIGS. 1 and 5. As shown, the Cooling Zone is divided into two sub-zones, CZ-1 and CZ-2. Although both are shown within the framework of the furnace 12, the CZ-2 may be external, after the transfer (XFER) to belts 28D carrying the wafers downstream for further processing, e.g., application of anti-reflective coating.

Note that the belts of FIG. 1 are replaced by roller chains 112 that are moved by sprocket 114 powered by motor 34 located below the outlet end of the furnace 20. Idler rollers, in this case sprockets/flanged wheels, 40A-40C are disposed at the inlet, outlet and at the upstream end of the return path R to redirect the chains in the drive loop shown. Tension is provided by spring-biased tension and idler system 44, disposed downstream of the drive 30. Guide rollers 116 and slideway blocks 74 are provided along the chain loop to maintain the path straight. Air knives 22 provide cooling compressed air over the chains in the cooling zone or external thereto. In addition, a tube cooler 118 may be provided in the return section to further cool the chain.

Figure 8:
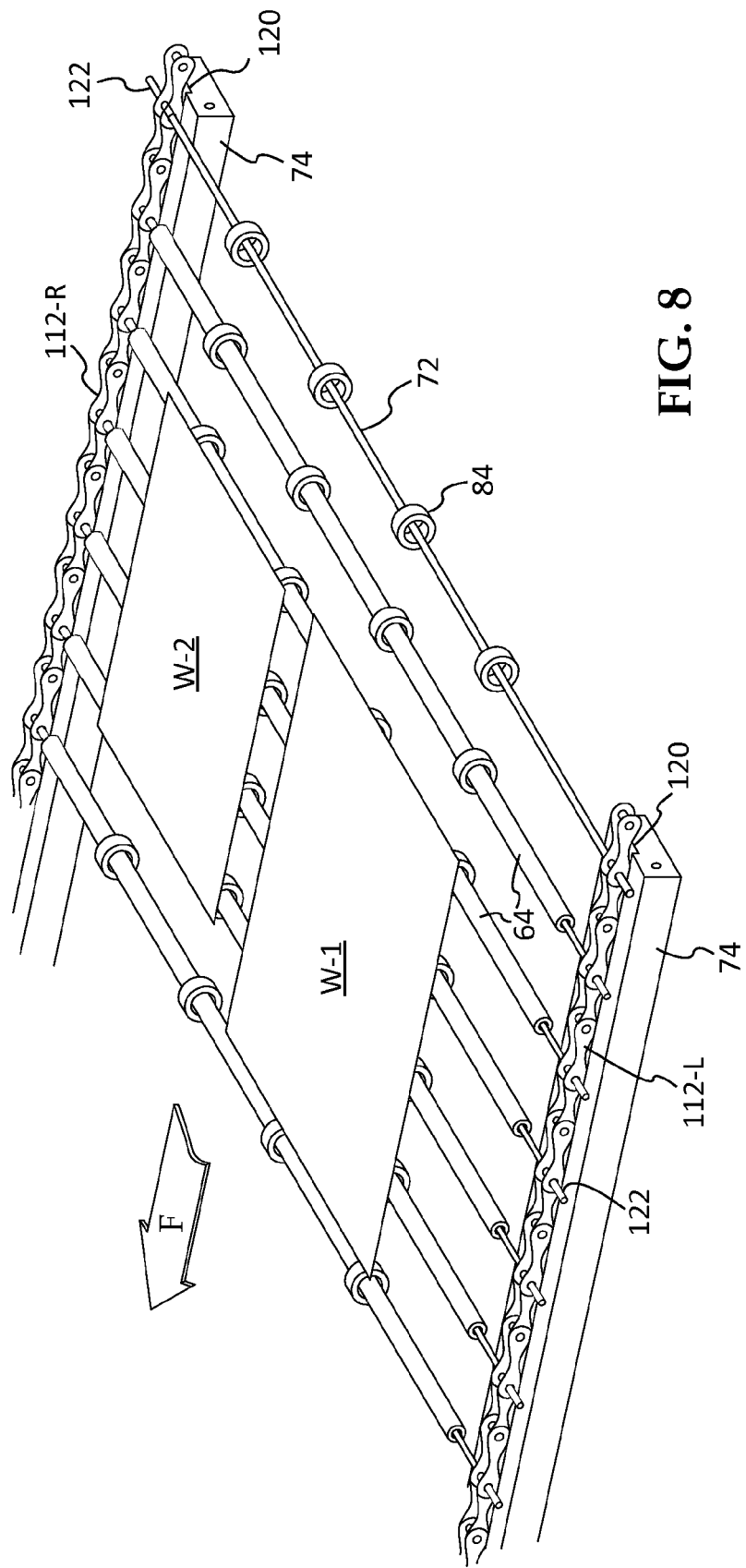
FIG. 8 is an enlarged view in isometric of the chain transport system in the furnace processing zone(s) showing transport of two exemplary wafers through the furnace.

FIG. 8 is analogous to FIG. 4A and shows how the two, spaced-apart chains 112-L (Left side) and 112-R (Right side) ride in grooves or channels 120 in slider blocks 74. The cross-wires 72 supporting the ceramic tubes 64 have ends 122 passing through tubular link sleeves 124. The link pivots are spaced about ½" apart (1.27 cm), and the tubular link sleeves 124 are provided in every other link, so that the wires 72 are spaced about 1" apart (2.5 cm apart).

FIG. 9 is an enlarged detail analogous to FIG. 4B, more clearly showing the alternate link journaling of the wires 72. The intermediate links have solid link pins 126. Both the link sleeves 124 and link pins 126 have overlying link rollers 128 (not shown in FIG. 9; shown in FIGS. 10A and 10B). The free ends 122 of the wires are terminated in push or threaded nuts, or other types of fasteners 130, 140 to keep the wires from falling out of the sleeves 124 (see FIGS. 10A, 10B).

Figure 10A:
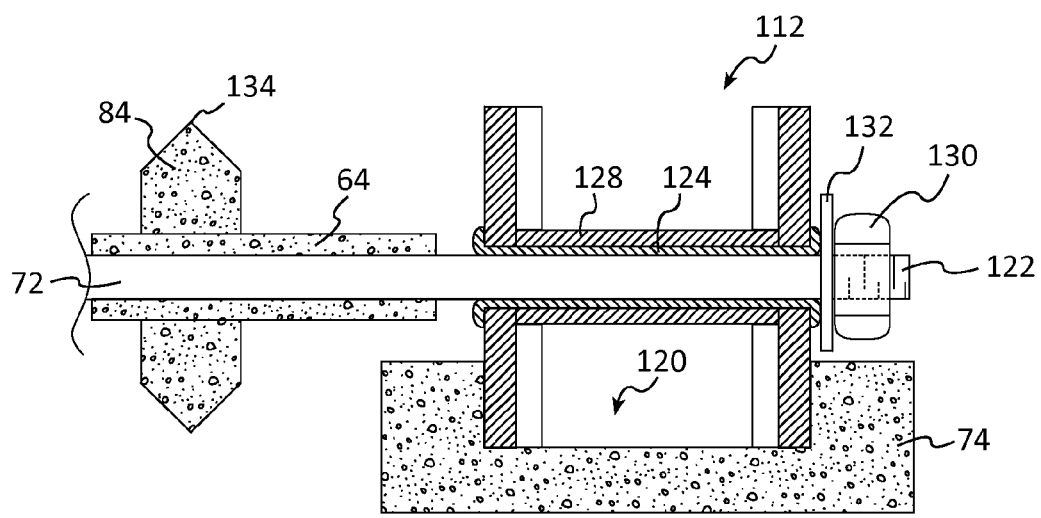
FIG. 10A is a vertical section view through the line 10A/B-10A/B of FIG. 9 showing a first embodiment of a slider plate guide for the chain drive, in this embodiment a channel.
Figure 10B:
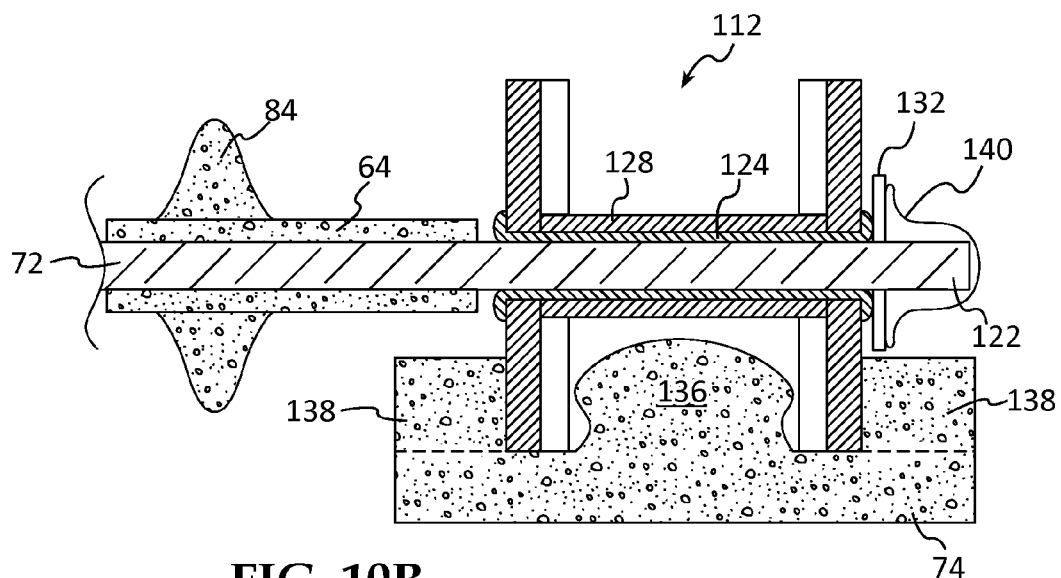
FIG. 10B is vertical section view through the line 10A/B-10A/B of FIG. 9 showing a second embodiment of a slider plate guide for the chain drive, in this embodiment a rib.

FIGS. 10A and 10B show two embodiments of the slider plates 74. In FIG. 10A the slider plate includes a groove or channel 120 in which the chain 112 rides. The free end 122 of the wire 72 is threaded to receive a locking nut 130. An optional spacing washer 132 is shown. The standoff 84 has an inverted V-shaped outer periphery, so that the wafers ride on the circumferential edge 134. In FIG. 10B, the slider plate 74 includes a ridge 136 that can have a wide range of configurations, including straight or curved (inclined) side walls. The side links of the chain 112 straddle and are guided by the ridge 136. In this embodiment, the slide block 74 usually does not have the outside blocks 138, the plate being flat on both sides of the ridge, as shown by the dashed line defining the side blocks 138. In addition, the tips 122 of the wire 72 are terminated by cap or push nuts 140. The contour of the stand off is a tapered peak, being a half sine-wave in cross section in this embodiment.

Figure 11A:
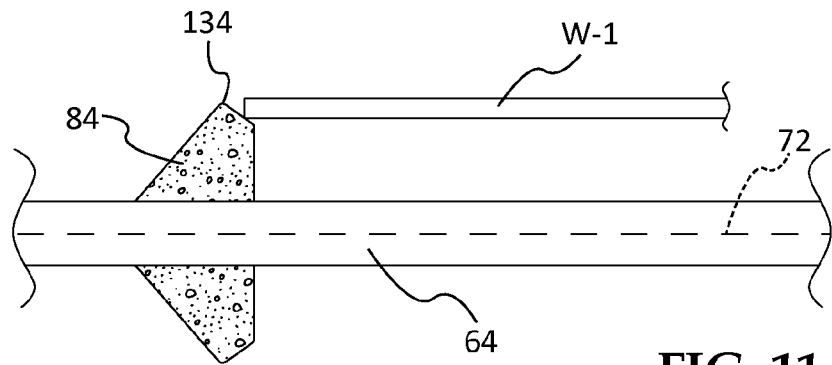
FIG. 11A is a vertical section view through the suspension wire and alumina tube showing a third embodiment of the wafer stand-off.
Figure 11B:
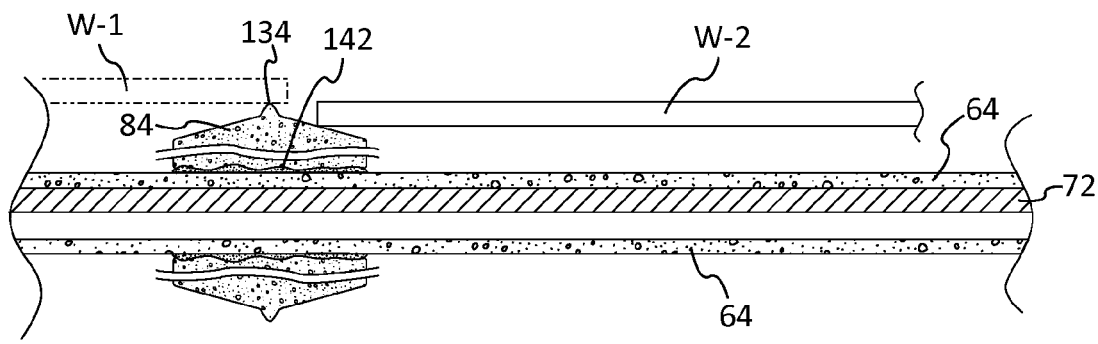
FIG. 11B is a vertical section view through the suspension wire and alumina tube showing a fourth embodiment of the wafer stand-off configuration.

FIGS. 11A and 11B show two additional embodiments of the standoffs 84, FIG. 11A showing an asymmetric fin-shaped standoff having a slanted outer face (right of the ridge 134), and vertical or slanted side faces. FIG. 11B shows the current best mode embodiment of the standoffs, a bilaterally tapered cone shape, optionally with an annular rib 134 at the apex where the two tapered sides merge. Either the rib or the long slant faces provide support for the wafer product, as shown by the positions of wafers W-1 and W-2, respectively, depending on the spacing of the standoffs 84 along the tubes 64 as compared to the width of the (wafer) products. Where the products are large, the bottom surface rests on the rib as shown by wafer W-1 (see also 96 in FIG. 4A), and where the products are not as wide as shown by wafer W-2, only the outer, lower edge of the product rests on the slanted face as shown. Note that larger (wider) wafers or products would rest farther up the slope or on the peripheral circumferential rib 134. This standoff embodiment is glued to the ceramic tube 64, rather than being integrally formed with the tube. The glue used is as described above. The horizontal break in the standoff body 84 illustrates that the vertical height of the standoff side walls may be selectively varied to accommodate the various transport and furnace designs and configurations.

Figure 12A:
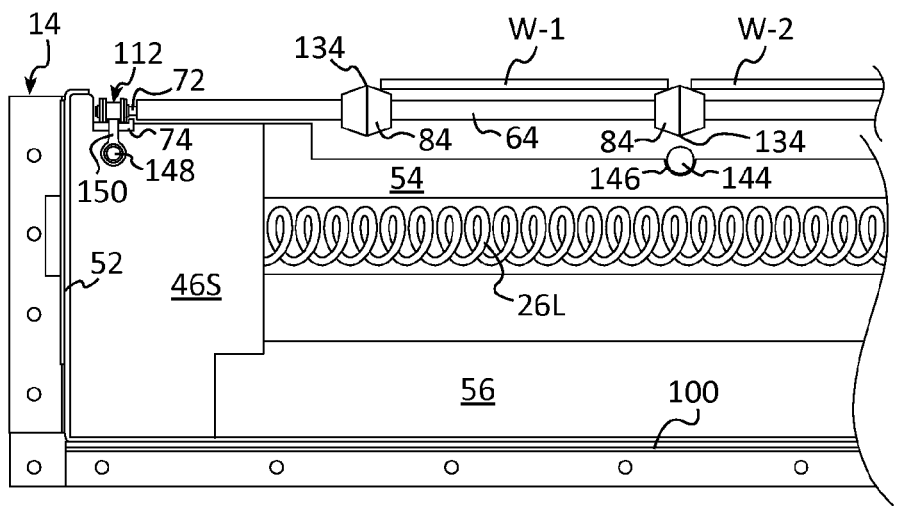
FIG. 12A is a transverse elevation view showing the spatial location and arrangement of the sag-arrester slider members with reference to the transport ceramic tube, standoff and wire assembly.

FIGS. 12A and 12B illustrate a presently preferred embodiment of an optional transport fail safe system comprising the use of sag-arresters arranged coordinately below the path of travel of standoffs. FIG. 12A shows in transverse elevation, spatial location and arrangement of the sag-arrester slider members 144 with reference to the transport assembly comprising the drive chain 112, ceramic tube 64, standoff 84 and wire 72.

As shown in FIG. 12A, the sag-arrester assemblies 144 function to prevent excess sag of the suspension wires or rods 72 that carry the ceramic tubes 64 and standoffs 84, in the event that they fail, e.g., by breakage or elongation of the wires under stress or heat. In a presently preferred embodiment, the sag-arrester assemblies comprise slider members 144, e.g., selected from quartz tubes, rods or strips, that are aligned parallel to the center line of the conveyor transport path shown by the Arrow F, which is coordinate with the longitudinal center line of the furnace firing zone. The arrester slider members 144 are spaced inwardly from the side walls of the furnace chamber a distance that brings them into alignment with, and spaced below the path of travel of the standoffs. Each longitudinal end of an arrester slider member is mounted in a notch 146 in a transverse wall 54 of the furnace firing zone 23 so that the top of the slider member is spaced above the top of the transverse wall 54. Thus, if and when a transport wire and tube assembly sags, the standoffs 84 will contact the slider member, slide along it as the transport advances, and clear the furnace transverse walls without snagging and breaking, or otherwise damaging the transport system. For example, the spacing between the top of the arrester slider member 144 and the bottom of the standoff 134 may be on the order of 1-2 cm. Further, since the arrester slider members are spaced in alignment with the paths of standoffs, they do not shadow the wafers (see wafers W-1 and W-2 of FIG. 11B), being off to the sides of the wafers.

Also, FIG. 12A shows compressed air tube 148 is provided above, below or to one side of each transport chain slider plate 74 in its insulation side wall block 46S, to provide cooling air to the bottom of the slider 74 and via holes 150 in the slider plate 74, to the drive chain 112.

FIG. 12B shows in isometric the bottom section 14 of an exemplary 5-lane (5 wafers wide) inventive diffusion furnace 10 which has been fitted with a pair of sag-arrester sliders 144, each aligned co-ordinate with and spaced below a line of standoffs 84. A transverse clearance shield plate 152 may be placed across the width of the furnace at the entrance end to insure clearance of any sagging wires as the transport is redirected up and around to the horizontal product transport level.

FIG. 13 shows process line 154 comprising a first doper apparatus Do-1 for doping the bottom surface of prepped Si wafers with a Boron doping composition, shown inlet into doper Do-1 by arrow B. After doping with B in Do-1 and drying of the wafer, it is inverted in flipper 158 so that the top surface of the wafer is facing upwardly. The inverted top-up wafer is then transferred into a second doper apparatus Do-2 wherein a Phosphorous doping compound P is coated onto the top surface of the wafer and dried. The dual, B/P-coated wafer is then transferred to an inventive diffusion furnace 10 for co-diffusion firing as described above herein, cooled in the cooling section of the furnace, and transferred to an anti-reflectance coating apparatus, ARC 158, wherein an anti-reflectance coating layer such as $SiN_3$ is applied by plasma enhanced chemical vapor deposition. After the ARC is applied, the wafer is transferred to a printing station, in which a printer/dryer apparatus 160 applies (only if needed, a back contact layer Al-based paste to the bottom surface; a B-doped bottom surface ordinarily does not need an Al-based back contact layer paste) an Ag-based paste "ink" in fine, spaced lines onto the P-doped/diffused top surface. The "printed" wafer is then transferred to a dryer 162 which burns off the organic binders of the pastes at temperatures not exceeding about 600-650° C., with the VOCs being exhausted at 164 as shown, then condensed out of the flue gases or incinerated in a thermal oxidizer. The printed wafers are transferred into a metallization furnace 166 where they are fired to flow the optional back contact paste into a continuous layer, and to form the fine grid of ohmic collectors on the front side burned into, but not through the p-n junction layer. The resulting cells 168 proceed to various cleaning, edging and testing steps before being striped and assembled into arrays for lamination between glass layers as completed solar panels.

Figure 14:
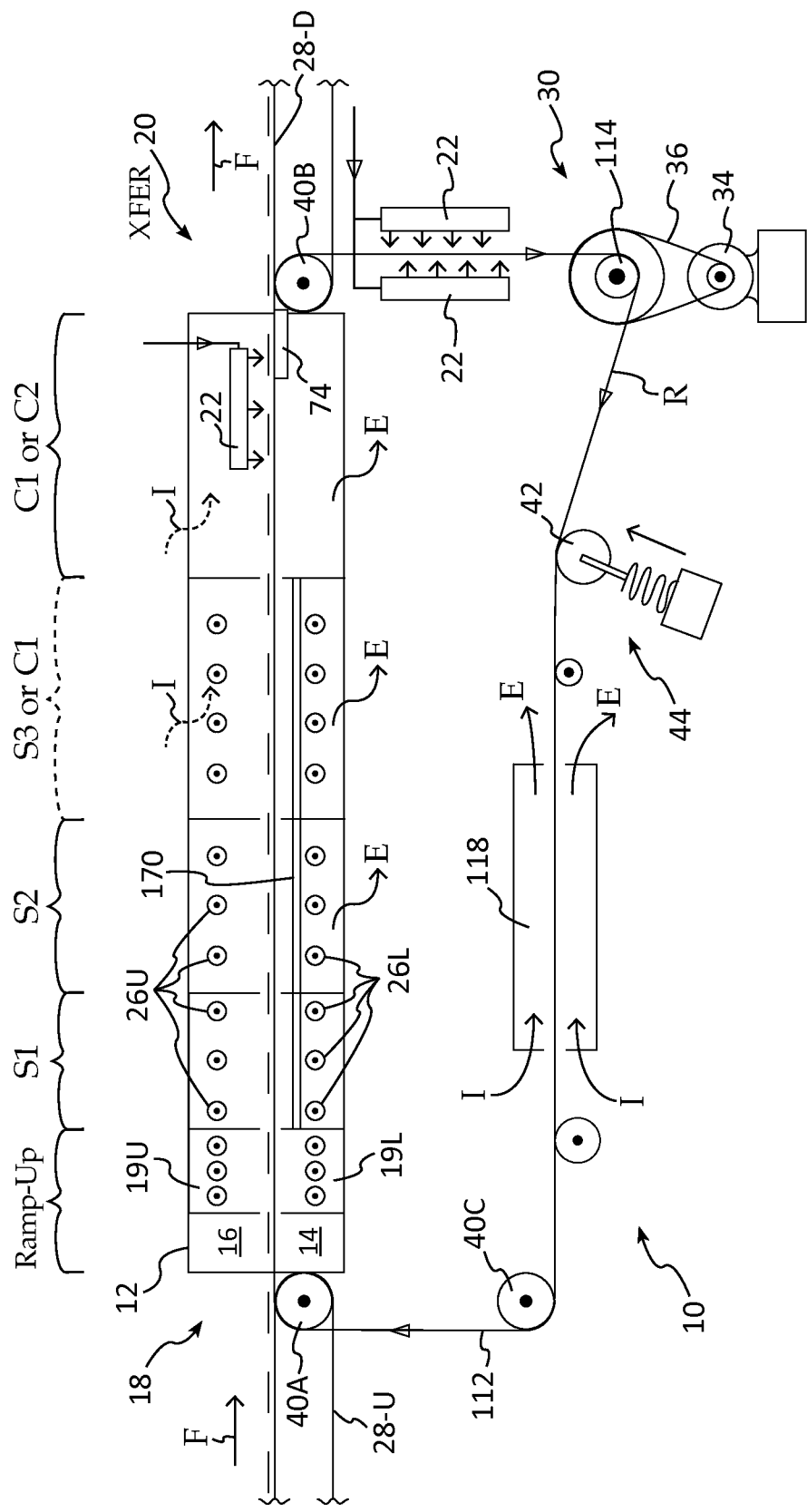
FIG. 14 is a horizontal schematic of a furnace employing the inventive conveyor system and longitudinal side wall resistive heaters in the Soak Zones lower action.
Figure 15:
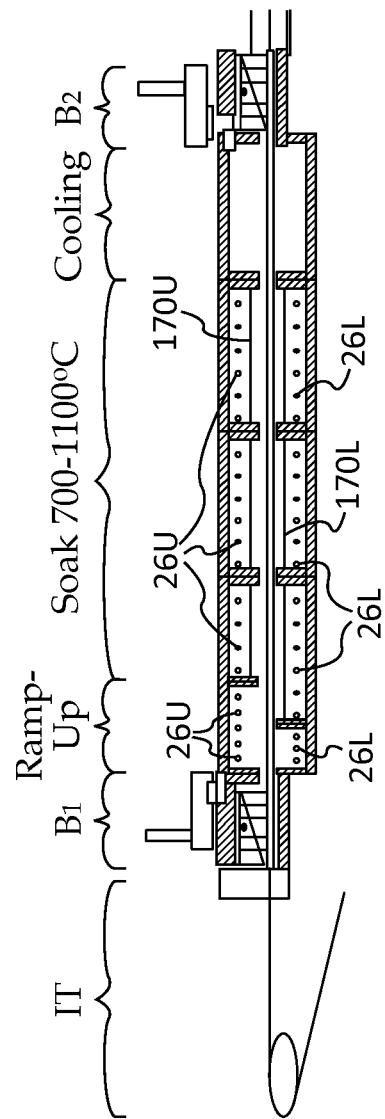
FIG. 15 is an alternating schematic embodiment of the inventive furnace employing longitudinal sidewall heaters in both upper and lower zones.
Figure 16:
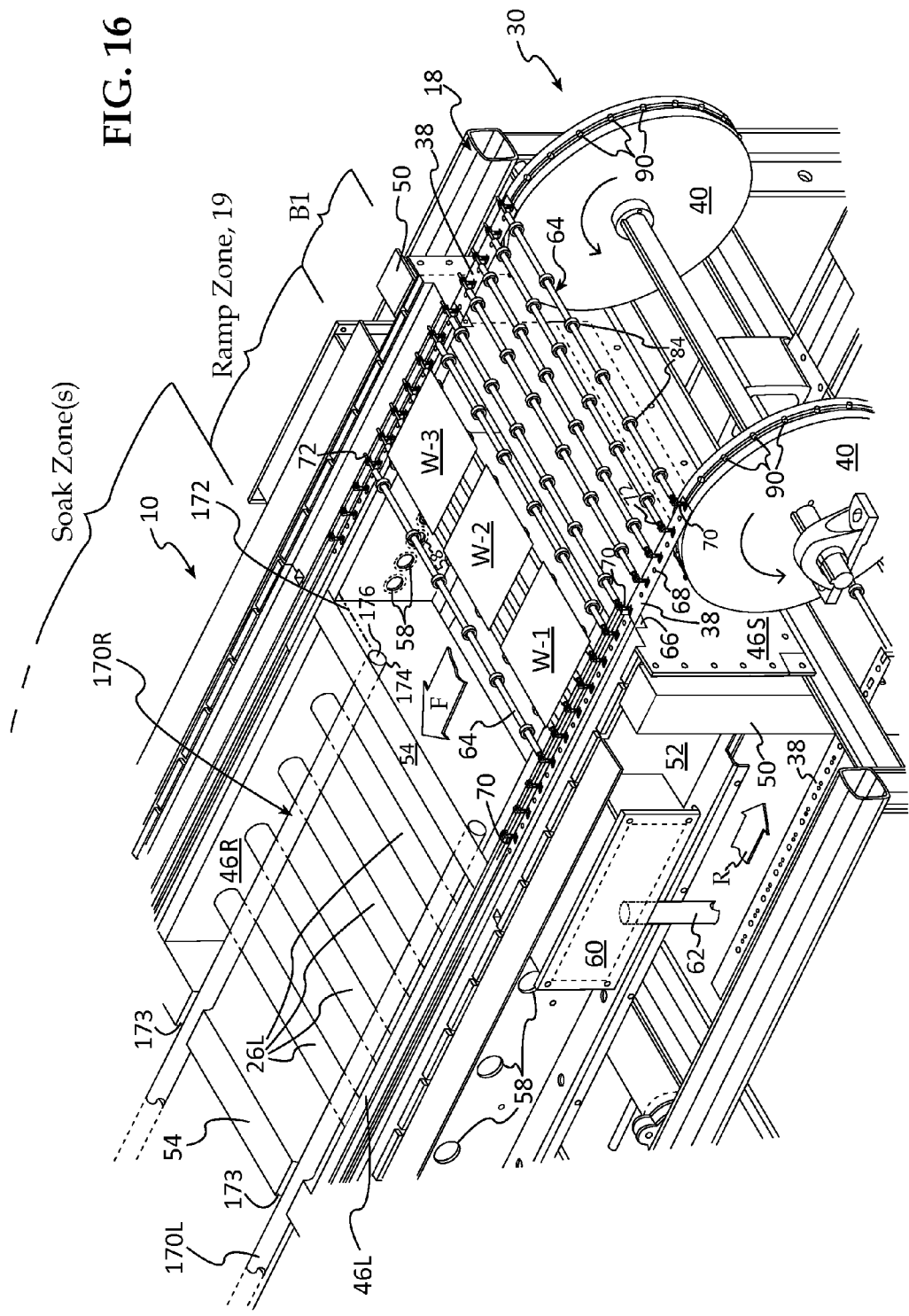
FIG. 16 is an isometric view of the inventive furnace system showing the placement of the longitudinal sidewall heaters above the IR lamps in exemplary Soak Zones.

FIGS. 14-16 illustrate the use of longitudinal side wall heaters to improve the lateral uniformity of heating in the various zones, principally the Soak Zones, so that the wafers transported in their respective lanes nearest the furnace side walls, e.g., Lanes 1 and 5 in a 5-lane-wide furnace are at processing temperature, evenly across their widths. The description of the parts and zones in FIGS. 1 and 7 that are the same applies for FIG. 15. In this embodiment the furnace zones are a Ramp Up Zone 19, followed by a plurality of Soak Zones S1, S2 . . . $S_n$, followed by at least one Cooling Zone CZ, such as C1 or/and C2. The lamps 26U and 26L in the zones provide the high IR flux for conditioning and heating. The Ramp Up Zone 19 (19U and 19L for upper and lower respectively) rapidly bring the wafers up from ambient to within a range of from about 500° C. to 700° C. or higher. The first Soak Zone S1 brings the wafers up to the required diffusion temperature in the range of from about 950° C. for P doping only to about 1100° C. for co-doping of P and B, front and back, top and bottom sides. The remaining Soak zones S2-$S_n$ retain the desired diffusion processing set point temperature. The wafers are then cooled in one or more Cooling Zones, C1, C2, etc. In this embodiment, side wall heaters 170 are disposed above the lamps in the lower halves of the Zones S1, S2 and in the zone C1 when it is replaced by a Soak Zone $S_n$, in this embodiment S3.

FIG. 15 shows the use of sidewall heaters 170U and 170L in both upper and lower zones. In this embodiment the sidewall heater 170L is used in the lower Ramp Up Zone. Heaters are used in all Soak Zones shown.

FIG. 16 shows in isometric a 3-lane furnace conveying wafers W-1, W-2 and W-3 in the direction F. The remaining parts numbers are the same as in FIG. 3A. The two side wall heaters 170R, 170L, for right and left side wall respectively are shown adjacent their side walls 46R and 46L and above the transverse lower lamps 26L in the Soak Zones(s). Optionally the side wall heaters can extend into the Ramp Up Zone 19 and/or the optional Firing Zone. The side wall heaters are placed a preselected distance 172 from the respective side wall 46R, 46L, ranging from about 1 to about 5 cm. They may be supported in notches 173 cut in the transverse zone divider blocks 54, or in through holes in those blocks (not shown). As shown the sidewall heater comprises an outer quartz tube 174 in which is placed the rode or coiled resistive elements ITS. These side wall heaters insure the outer edges (edges closest to side walls 46R and 46L of wafers W-1 in Lane 1 and W-3 in Lane 3 are evenly heated, edge to edge.

INDUSTRIAL APPLICABILITY

The inventive diffusion furnace of this application has wide applicability to the solar cell manufacturing industry, namely to the process steps of firing solar cell wafers to cause the diffusion and co-diffusion of P or/and B into the wafer substrate to make p-n junction layers or conductive back surface layers. The system is clearly an improvement over currently available furnaces, providing greater throughput by virtue of substantially shorter processing time, less shadowing, lower energy requirements, less process contamination of wafers, and improved uniformity in the p-n junction layer and the B-doped back surface layer. Thus, the inventive system has the clear potential of becoming adopted as the new standard for apparatus and methods of diffusion of dopants into the solar cell advanced material wafers.

It should be understood that various modifications within the scope of this invention can be made by one of ordinary skill in the art without departing from the spirit thereof and without undue experimentation. This invention is therefore to be defined by the scope of the appended claims as broadly as the prior art will permit, and in view of the specification if need be, including a full range of current and future equivalents.

The invention claimed is:

1. A continuous conveyor diffusion furnace for processing solar cell wafers, comprising in operative combination:
   a) a plurality of heating and cooling zones oriented in sequence from a furnace inlet to a furnace outlet,
      i) said zones being disposed in abutting relationship to define there-through a continuous longitudinal processing conveyor path oriented in a generally horizontal plane, each of said zones including spaced-apart outer side walls between which is defined a process volume, said process volume being divided into a zone upper half portion and a zone lower half portion along a horizontal plane that is generally parallel to said processing path plane;
      ii) said heating zones including heating elements selected from IR lamps and resistance radiation elements oriented transverse to said longitudinal processing conveyor path to heat said process volume;
      iii) said transversely oriented heating elements being disposed in at least some of said heating zones in at least one of said zone upper half and said zone lower half;
      iv) at least one pair of resistance heating elements disposed in at least one of said heating zones lower half portions or/and upper half portions, said resistance radiation elements are oriented parallel to said longitudinal processing conveyor path, one of each pair being disposed adjacent one of said outer side walls;
   b) a low-mass conveyor system for receiving and moving solar cell wafers along said longitudinal processing path from said furnace inlet to said furnace outlet through said zones, said conveyor system comprising:
      i) a plurality of spaced apart, high temperature resistant, metallic wires oriented transverse said to said longitudinal processing path, said wires having a length defining a useful wafer transport width between said side walls of said conveyor system through said furnace zones;
      ii) small diameter, thin walled, non-rotating refractory tubes suspended on said wires to provide support for said wafers as they are transported through said furnace zones by said conveyor system and to substantially completely shield said wafers from metallic vapors de-gassing from said wires;
      iii) said refractory tubes extending at least a substantial portion of the length of said wires and positioned on said wires to leave exposed only short opposed side ends of said wires;
      iv) a pair of spaced-apart transport members, one disposed adjacent each end of said wires, each of said transport members forming a continuous loop through said longitudinal processing path from furnace inlet to said furnace outlet, and thence on a return path outside said furnace zones back to said inlet;
      v) each of said transport members include a plurality of receiving members spaced uniformly along each of said transport member continuous loop, each said receiving member is configured to removably retain said short, side end of said wire disposed suspended between said transport members across said transport width; and
   c) a drive system disposed outside said furnace zones disposed to engage both said transport members for synchronous movement through said zones as said transport members carry said plurality of refractory tubes and wires suspended between said receiving members, on which refractory tubes said wafers are transported through said zones during furnace operation to process them.

2. A continuous conveyor diffusion furnace as in claim 1 wherein said transport includes at least one of:
   a) loop members selected from bands and roller chains;
   b) wherein when bands are employed, said bands include vertically extending pylons into which said wire ends are received; and
   c) wherein when roller chains are employed, said roller chains include tubular pivot links, into which said wire ends are received.

3. A continuous conveyor diffusion furnace as in claim 1 wherein said transport system includes at least one of:
   a) said refractory tube wafer support members are formed of a ceramic or vitreous material;
   b) said ceramic or vitreous material contains at least one of silica, zirconia and alumina;

c) said refractory tubes include annular standoffs on which the wafers rest, said annular standoffs are disposed spaced apart along the refractory tubes to provide multiple, substantially point contacts with said wafers thereby resulting in less heat transfer and less contamination from said conveyor system; and d) wherein when standoffs are employed, said standoffs have a wide range of external configuration profiles, exemplary ones being selected from conical, rounded (donut-shaped), vertical knife edge, slanted, conical, biconical, bilaterally tapered cone, square top, fin, rib, and combinations thereof.

4. A continuous conveyor diffusion furnace as in claim 1 wherein said transverse heating elements are arrayed in a plurality of process heating zones, including, in sequence from inlet end to outlet end, zones selected from one or more of a Baffle Zone, a Ramp-Up Zone, a High Intensity IR Zone, a Soaking Zone, and a Cooling Zone.

5. A continuous conveyor diffusion furnace as in claim 4 wherein said IR heating is provided by high intensity 1R lamp elements disposed in at least one array selected from above said wafer transport path to direct high intensity, high flux 1R irradiation downward onto a top surface of said wafers and below said path to direct high intensity, high flux IR irradiation upwardly between said spaced conveyor system refractory tubes onto a portion of the underside surface of said wafers.

6. A continuous conveyor diffusion furnace as in claim 5 wherein said resistance heating elements are disposed in at least some of said lower half portions of said Ramp-Up, High Intensity IR, and Soaking Zones.

7. A continuous conveyor diffusion furnace as in claim 1 wherein said lower half zones portions are mounted non-movably fixed in a frame-work, said furnace including a plurality of powered vertical lifting members disposed connected to said upper and lower half furnace zones portions, said vertical lifting members being disposed to lift said upper half zones portions relative to said fixed lower half zones portions to expose and permit access to the furnace heating zone interior for inspection, adjustment, maintenance and repair as needed.

8. A continuous conveyor diffusion furnace as in claim 1 wherein said upper half portions are mounted non-movably fixed in a frame-work, said furnace including a plurality of powered vertical lifting members disposed connected to said upper and lower half furnace zones portions, said vertical lifting members being disposed to lower said lower half zones portions relative to said fixed upper half zones portions to expose and permit access to the furnace heating zone interior for inspection, adjustment, maintenance and repair as needed.

9. A continuous conveyor diffusion furnace as in claim 1 which includes sag-arrester assemblies mounted in a lower half portion of at least some of said furnace zones, disposed spaced below and coordinately aligned with said standoffs.

10. A method of continuous diffusion or co-diffusion layer firing of Photo-Voltaic (PV) solar cell wafers having a bottom surface and a top surface, comprising the steps of:

a) applying at least one dopant composition to at least one of said wafer bottom surface and said wafer top surface to produce a plurality of wafers doped on at least one of said top and bottom surfaces with a layer of dopant composition;

b) transporting said plurality of said co-doped wafers sequentially through a plurality of heating and cooling zones from a furnace inlet to a furnace outlet, said zones being disposed in abutting relationship to define a continuous longitudinal processing conveyor path oriented in a generally horizontal plane and said wafers being oriented with said top surface facing upward;

c) supporting said wafers during said transporting step on a low-mass conveyor system comprising small diameter non-rotating refractory tubes supporting said wafers, which refractory tubes are suspended on wires spanning across the wafer processing path from a first longitudinal outer side of said furnace to a second longitudinal outer side of said furnace, and which wafers are continuously advanced through said zones at a selected rate; and d) heating said wafers directly by at least one of IR lamp radiation and thermal resistance radiation or re-radiation directed onto said top and bottom surfaces in said heating zones for a time sufficient to promote diffusion of said dopant from said coating layer into said wafer substrate material to complete development of at least one of a p-n junction top surface layer and a back contact bottom surface layer.

11. Method as in claim 10 which includes the step of maintaining even heat laterally across said wafer processing path by resistance radiation applied from longitudinal resistance heating elements disposed in at least one of said heating zones adjacent and parallel to said outer side walls.

12. Method as in claim 10 wherein said heating zones are divided along a plane generally parallel to said processing path horizontal plane into upper heating zones portions and lower heating zones portions, and applying heat from resistance heating elements disposed in at least one lower heating zone portion.

13. Method as in claim 10 wherein at least some of said heating is provided by High Intensity IR lamps in at least one zone powered to provide high intensity, short wavelength infra-red radiant flux, said lamps being operated for at least a portion of the processing time at above about 40% maximum lamp-rated power, said irradiation being of sufficiently high flux to photo-condition a wafer surface and to raise the temperature of said wafer to a range of from about 700° C. to about 950° C. to promote diffusion of P from said dopant layer into said wafer substrate material top surface to complete development of an n-p junction layer.

14. Method as in claim 10 wherein at least some of said heating is provided by radiative elements operated at power sufficient to raise the temperature in at least a firing zone within the range of from about 950° C. to about 1100° C. to promote diffusion of B from said dopant layer into said wafer substrate material to complete development of a back contact layer.

15. Method as in claim 10 wherein at least some of said heating is provided by High Intensity IR lamps in at least one zone powered to provide high intensity, short wavelength infra-red radiant flux, said lamps being operated for at least a portion of the processing time at above about 40% maximum lamp-rated power, said irradiation being of sufficiently high flux to photo-condition a wafer surface and to raise the temperature of said wafer to a range of from about 500° C. to about 950° C.

16. Method as in claim 15 wherein the infra-red wavelength peak is maintained at about 1.25 microns in at least one zone.

17. Method as in claim 10 wherein the dwell time in said diffusion process from inlet to outlet ranges from about 4 to about 10 minutes.

18. An apparatus for thermal processing of Si wafers, having a top surface and a bottom surface, in steps of diffusion and metallization comprising in operative combination:

a) at least one doper module for applying a doping composition selected from at least one of a Boron dopant composition and a Phosphorous dopant composition;

b) a continuous conveyor IR lamp-heated diffusion furnace receiving doped Si wafers from said doper module, said diffusion furnace having an elongated heating zone that is split horizontally at the level of the conveyor into an upper portion and a lower portion, and which includes lifting devices that permit relative motion of the upper and lower portions to provide access to the interior of said heating zone, said furnace being adapted for diffusion firing of doped Si wafers;

c) an anti-reflectance coating module disposed downstream of said diffusion furnace to receive diffusion fired Si wafers from said diffusion furnace and including means for applying an anti-reflectance coating (ARC) to at least a top face of said Si wafers;

d) a printer/dryer module disposed downstream of said anti-reflectance coating module to receive said ARC-coated Si wafers, said printer/dryer module including means for application of back contact paste to said bottom surface and printing fine collector lines on said top surface to produce printed wafers;

e) a dryer module for receiving and heating said printed wafers in an IR lamp-heated zone to up to about 650° C. to burn off volatile organic binders from said paste and lines on said top and bottom surfaces of said printed Si wafers; and f) a metallization furnace having an elongated heating zone that is split horizontally at the level of the conveyor into an upper portion and a lower portion, and which includes lifting devices that permit relative motion of the upper and lower portions to provide access to the interior of said heating zone, said furnace being adapted for IR lamp-heated metallization firing of printed Si wafers to within the range of from about 750° C. to about 1100° C.; thereby to produce Si wafers ready for processing, including cleaning, testing and lamination, into solar panel arrays.

19. An apparatus for thermal processing of Si wafers as in claim 18 wherein said diffusion furnace includes:

a) a plurality of heating and cooling zones oriented in sequence from a furnace inlet to a furnace outlet, said zones being disposed in abutting relationship to define there-through a continuous longitudinal processing conveyor path oriented in a generally horizontal plane;

b) a low-mass conveyor system for receiving and moving solar cell wafers along said longitudinal processing path from said furnace inlet to said furnace outlet through said zones, said conveyor system comprising:

i) a plurality of spaced apart, high temperature resistant, metallic wires oriented transverse said to said longitudinal processing path, said wires having a length defining a useful wafer transport width of said conveyor system through said furnace zones;

ii) small diameter, thin walled, non-rotating refractory tubes suspended on said wires to provide support for said wafers as they are transported through said furnace zones by said conveyor system and to substantially completely shield said wafers from metallic vapors de-gassing from said wires;

iii) said refractory tubes extending at least a substantial portion of the length of said wires and positioned on said wires to leave exposed only short opposed side ends of said wires;

iv) a pair of spaced-apart transport members, one disposed adjacent each end of said wires, each of said transport members forming a continuous loop through said longitudinal processing path from furnace inlet to said furnace outlet, and thence on a return path outside said furnace zones back to said inlet;

v) each of said transport members include a plurality of receiving members spaced uniformly along each of said transport member continuous loop, each said receiving member is configured to removably retain said short, side end of said wire disposed suspended between said transport members across said transport width; and c) a drive system disposed outside said furnace zones disposed to engage both said transport members for synchronous movement through said zones as said transport members carry said plurality of refractory tubes and wires suspended between said receiving members, on which refractory tubes said wafers are transported through said zones during furnace operation.

20. An apparatus for thermal processing of Si wafers as in claim 18 which includes a first doper module for applying said Boron dopant composition to said bottom surface of said wafers, and a second doper module for applying said Phosphorous dopant composition to said top surface of said wafers, said first doper module feeding doped wafers to a flipper module having means for inverting said wafers so that said top surface is facing upwardly and said inverted, top surface up wafers are transferred to said second doper module.

* * * * *